US008913699B2

(12) United States Patent
O'Keeffe et al.

(10) Patent No.: US 8,913,699 B2
(45) Date of Patent: Dec. 16, 2014

(54) COMMUNICATION UNIT, INTEGRATED CIRCUIT AND METHOD OF DIVERSE POLARIZATION

(75) Inventors: Conor O'Keeffe, Passage West (IE); Joe Moore, Terenure (IE)

(73) Assignee: Socowave Technologies, Ltd., Dublin (IE)

( * ) Notice: Subject to any disclaimer, the term of this patent is extended or adjusted under 35 U.S.C. 154(b) by 249 days.

(21) Appl. No.: 13/515,916

(22) PCT Filed: Dec. 8, 2010

(86) PCT No.: PCT/EP2010/069153

§ 371 (c)(1), (2), (4) Date: Aug. 1, 2012

(87) PCT Pub. No.: WO2011/073065

PCT Pub. Date: Jun. 23, 2011

(65) Prior Publication Data

US 2012/0287978 A1 Nov. 15, 2012

(30) Foreign Application Priority Data

Dec. 17, 2009 (GB) .................................. 0921956.9

(51) Int. Cl.
*H03D 1/04* (2006.01)
*H01Q 21/24* (2006.01)

(52) U.S. Cl.
CPC .................................. *H01Q 21/245* (2013.01)
USPC ............ 375/346; 375/316; 375/295; 375/219

(58) Field of Classification Search
USPC .................................. 375/346, 316, 295, 219
See application file for complete search history.

(56) References Cited

U.S. PATENT DOCUMENTS

| | | | | |
|---|---|---|---|---|
| 4,737,793 | A | 4/1988 | Munson et al. | |
| 4,937,582 | A | 6/1990 | Mohuchy | |
| 5,068,668 | A | 11/1991 | Tsuda et al. | |
| H1079 | H | 7/1992 | White et al. | |
| 6,049,705 | A * | 4/2000 | Xue | 455/277.1 |
| 6,144,339 | A | 11/2000 | Matsumoto et al. | |
| 2007/0046558 | A1* | 3/2007 | Tillery | 343/797 |
| 2008/0042846 | A1* | 2/2008 | Jenkins et al. | 340/572.7 |
| 2010/0202565 | A1* | 8/2010 | Abbasfar | 375/308 |

FOREIGN PATENT DOCUMENTS

| | | | |
|---|---|---|---|
| EP | 0416264 | A2 | 3/1991 |
| EP | 1320202 | A2 | 6/2003 |
| EP | 1693922 | A1 | 8/2006 |
| GB | 2467773 | | 2/2012 |
| WO | 00/01033 | | 1/2000 |
| WO | 02/31917 | A2 | 4/2002 |

(Continued)

*Primary Examiner* — Zewdu Kassa
(74) *Attorney, Agent, or Firm* — Frank M. Scutch, III

(57) ABSTRACT

A method for processing at least one polarization type of at least one wireless signal by a communication unit operably couplable to an antenna arrangement that comprises at least two orthogonally polarized antenna elements. The method comprises processing at least one signal radiated by at least one first antenna element of the antenna arrangement; and processing the at least one signal where processing comprises at least applying at least one digital complex scaling operation on the at least one signal radiated by at least one second antenna element of orthogonal polarization to the at least one first antenna element of the antenna arrangement thereby radiating at least one wireless signal of at least one non-native polarization type.

23 Claims, 10 Drawing Sheets

(56) References Cited

FOREIGN PATENT DOCUMENTS

| | | | |
|---|---|---|---|
| WO | 03/055080 | A2 | 7/2003 |
| WO | 2006/136793 | A1 | 12/2006 |
| WO | 2008/076641 | A1 | 6/2008 |
| WO | 2009/043917 | A1 | 4/2009 |

* cited by examiner

COMMUNICATION UNIT, INTEGRATED CIRCUIT AND METHOD OF DIVERSE POLARIZATION

FIELD OF THE INVENTION

The field of the invention relates to an antenna arrangement and method for processing polarization types of radiated signals.

BACKGROUND OF THE INVENTION

Wideband Code Division Multiple Access (WCDMA) communication, as used in third generation (3G) mobile cellular communications air interface technologies, is an 'interference limited' technology from a data throughput perspective. CDMA technology utilizes orthogonal variable spreading factor (OVSF) codes combined with pseudo noise (Pn) codes to differentiate between multiple wireless subscriber communication units (referred to as user equipment (UE) in 3G terminology) that are utilizing the same spectrum at the same time. Often, up to ninety six UEs are simultaneously supported in call mode for a specific base station (referred to as Node-B in 3G terminology). Thus, a major factor in the design of cellular communication systems, is the ability to differentiate between different communications (or communication units).

Conventional antenna arrays, comprising multiple antenna elements and used with existing Node-B equipment in most 3G installations, utilize a fixed 65° beam pattern. Outside of the main lobe of the antenna beam the signals are spatially filtered and significantly attenuated. Conventional network planning and passive antenna array solutions process all incoming signals with a common fixed beam pattern. Such receive processing, based on signals received within the geographic area identified by the antenna beam main lobe, referred to as the RF footprint, tends to dictate a corresponding common beam pattern for transmitter operation. Thus, an identical radio frequency (RF) footprint is used for both receive (Rx) and transmit (Tx) operation.

Receive beam-forming using antenna arrays depends on the ability to constructively add incident signals on each of the antenna elements in a way that coherently adds those from the desired direction. Thus, incident signals that are not from the desired direction will be incoherently added, and thus will not experience the same processing gain. The term 'coherency' implies that the signals will have substantially the same phase angle. In addition, thermal noise from multiple sources also exhibits incoherent properties, and thus when added the signals from multiple sources do not experience the same processing gain as a coherent desired signal. Conversely in transmit active antenna arrays the signals are coherently combined within the intended beam pattern as electromagnetic (EM) signals in the 'air' so that they arrive coherently at the mobile station (MS) (e.g. UE) receiver.

Due to the number of concurrent communications that a Node-B is required to support, a number of techniques have been developed to assist in ensuring that a radio link performance adheres to adequate service levels, such as antenna diversity (where beam patterns are used to focus on (and separately process) communications to a particular sector of a cell) and polarization diversity (where different polarizations of antenna are used in order to maximize a received signal level from different communications units.

HSPA+, also known as Evolved High-Speed Packet Access is a wireless broadband standard defined in 3GPP release 7. HSPA+ provides HSPA data rates up to 56 Mbit/s on the downlink and 22 Mbit/s on the uplink with multiple input and multiple output (MIMO) technologies and higher order modulation (64QAM). Recent trials in HSPA+ networks have uncovered a problem with capacity and coverage issues with single antenna UE devices, The intention of HSPA+ is that it should be backward compatible to all network UEs including those supporting just HSPA and Release 99 versions of the 3G standard. HSPA+ introduces and utilizes transmit diversity on the Node-B network element. MIMO transmission on HSPA+ intends to use polarization diversity for transmission of the second carrier on the same frequency as the first. Network operators and 3GPP standards intend to use a common pilot channel (CPICH) on one of the polarization transmissions and no CPICH on the other. CPICH is used by UE devices in the rake receiver for both the channel equalisation and rake receiver channel estimator. In the absence of a CPICH, for example if it is not transmitted from the node-B, alternate equalisation and rake receiver channel estimator techniques may be employed. Usually an algorithm such as a minimum mean square error (MMSE) algorithm is used to estimate the weights and delays of the Rake receiver in WCDMA based receptions without the CPICH being present.

Single antenna legacy 3G UE devices typically use just one equalisation method at any one time. If for example the CPICH is used, then the MMSE mode is disabled and vice-versa. A network in HSPA+, transmitting with both CPICH and non-CPICH modes on orthogonal polarizations, implies that an untracked and uncorrelated transmission is used to that is not capable of being equalized out with just one equalisation method. Thus, a disastrous impact on single antenna UE receiver performance manifests itself. HSPA+ enabled devices with receive diversity are capable of increased data rate throughput by exploiting the second transmit diversity path on the Node-B.

Orthogonal LHCP (Left Hand Circularly Polarized) and RHCP (Right Hand Circularly Polarized) antennas for MIMO (Multiple Input Multiple Output) transmission in network trials has proved to be successful in minimising this problem with single antenna UE devices. This implies that an antenna for the node B must be capable of concurrent transmission in LHCP and RHCP, whilst reception using a XPOL (cross polarized) antenna is still preferred, given that UE devices have been predominantly designed using LP (Linear Polarized) antennas.

In the examples herein described, an antenna element is a radiative structure whose purpose is to convert electro-magnetic (EM) signals to electrical signals, or vice versa, in which a singular element has a fixed radiation pattern. The term 'radiative elements' described herein refers to elements capable of radiating an electromagnetic signal. Furthermore, the term 'radiative elements' described herein also encompasses structures capable of absorbing EM radiation and converting to electrical signals. These elements, constructed as an array can be configured to have various radiation patterns by manipulation of electrical signals coupled to the elements. Thus, the ability to alter the radiative beam shape may be achieved.

For completeness, it is worth clarifying the Antenna Reciprocity Theorem, which in classical treatises on electromagnetic fields and antennas is usually formulated as follows:

Given two antennas 'A' and 'B' placed at some distance apart, each of them may be operated either as a transmitting antenna or as a receiving antenna. Suppose that antenna 'B' is kept intact, whilst the performance of antenna 'A' as a transmitter is modified. A consequence of this is that, for a fixed amount of input power, the signal received by antenna 'B' changes by a factor 'F' due to the change imposed on antenna 'A'. Then the same modification changes also the performance of antenna 'A' as a receiver and does so by the same factor 'F'. The theorem follows from certain symmetries of Maxwell equations and its validity is easily verified experimentally and has been widely published. Hence, the radiation pattern induced by a transmitter operably coupled to an antenna with same carrier frequency as a receiver has identical azimuthal angular link loss. Thus, the term radiative and 'radiative beam pattern' hereinafter may also be applied to a receiver.

Referring now to FIG. 1, examples of known electromagnetic waveforms are illustrated. A first diagram 100 illustrates a linear polarized field from an antenna and a second diagram 150 illustrates a circular polarized field. The polarization of an antenna is the orientation of the electric fields (E-plane) 110 of the radio wave with respect to the Earth's surface and is largely determined by the physical structure of the antenna and by its orientation. The magnetic field (H-plane) 120 is always perpendicular to the E-plane 110. The E-plane 110 and H-plane 120 are respectively illustrated as propagating in the directions 105, 115. In contrast, circular polarized (CP) antennas as illustrated in the second diagram 150 have a rotating E-plane 160 in a propagation direction 155, in contrast to the linear polarized (LP) antennas having a fixed E-plane.

Circular polarization is the polarization of electromagnetic radiation, such that the tip of the electric field vector describes a circle in any fixed plane intersecting, and normal to, the direction of propagation. However, in practical systems there will be minor deviations from this perfect angular electric field vector that describes a circle. For the purposes of the description hereinafter described an E-Field vector that is substantially close to that of a circle is considered to be a circularly polarized field.

Elliptical polarization is the polarization of electromagnetic radiation, such that the tip of the electric field vector describes an ellipse in any fixed plane intersecting, and normal to, the direction of propagation. Elliptical polarized fields can be configured as circularly polarized fields, and can be rotated polarized fields in a clockwise or counter clockwise direction as the field propagates; e.g. forming right hand elliptical polarization and left hand elliptical polarization respectively. An elliptically radiated field will have substantially changed magnitude for 90° change in angular vector.

Cross-polarization (XPOL) antennas are also often used, particularly in cellular infrastructure deployments. XPOL antenna technology utilizes pairs of two LP antenna elements that are orientated substantially 90° with respect to each other, often referred to as being 'orthogonal' to each other, usually at +45° and −45° polarization. These pairs are often elements in an array, and thus can be arranged such that a desired propagation beam shape is developed. To date, deployed cellular infrastructure transmit polarization orientation predominantly only uses one of the polarization types whereas receive functionality is performed in both polarizations, with separate and independent processing of the two XPOL receive paths being employed. These XPOL antennas can be of patch construction (PCB) or of Dipole (Wire) construction.

Increasingly single mobile device and infrastructure equipment has to be capable of processing data for communication over more than one air interface access method. For example, the interfaces may include 3G, satellite, digital broadcast, etc. Many of these air interface methods may use different polarization techniques. For example DVB-SH s-band satellite broadcast services use CP, whereas cellular infrastructure use, as a general rule, +45° LP polarization transmission.

A known problem in using LP transmissions is that the polarization of the transmitted signal antenna and the receiving signal antenna need to have the angle of polarization exactly the same for reception of the strongest signal. For example a signal transmitted on a vertically polarized (VP) antenna and received on an antenna with horizontal polarized (HP) may have 10's of dB difference in received power compared to a matched VP antenna. Mobile handset antennas are generally LP, though increasingly through means of diversity reception paths a second polarization diversity LP antenna is utilized, orthogonally polarized to the first.

Furthermore, using CP the orientation of the receiving device is less critical to reception performance. However, an undesirable loss of around 3 dB in signal level, over the peak signal achievable with a matched LP antenna, would generally be expected of an equivalent CP antenna if receiving LP polarized wireless signals where each antenna has similar antenna gain.

WO/2000/001033 describes a portable adaptive polarization scanning satellite antenna system that performs receive only functionality using an analogue adjustment of RF phase shifters, in order to rotate the phase of the received signals at XPOL antenna elements. The system disclosed in WO/2000/001033 performs receive-only functionality of one reception type at any single instant in time. The single reception type at any single instant in time includes configuring VP and HP antennas to receive independently LHCP or RHCP signals. Thereafter, phase shifting XPOL elements is performed to better match incoming signal polarization.

U.S. Pat. No. 5,068,668 describes an adaptive polarization combining system that attempts to adapt an angle of an incoming signal phase of either of two polarized antennae, such that two incoming signals can be maximally combined, i.e. in phase. U.S. Pat. No. 5,068,668 describes a system that uses two orthogonally placed antennae of either CP or LP polarization. Again, the system disclosed in U.S. Pat. No. 5,068,668 performs receive-only functionality of a single signal reception path of one reception type at any single instant in time. Furthermore, U.S. Pat. No. 5,068,668 does not change the polarization type of the signals processed through the antenna, but provides a scheme to adaptively add them to maximise received signal strength.

U.S. Pat. No. 4,737,793 describes a radio frequency antenna with controllably variable dual orthogonal polarization of two signals (of common polarization type but orthogonal, such as LHCP and RHCP) to be applied to the antenna. U.S. Pat. No. 4,737,793 proposes a microstrip-based XPOL antenna with radio frequency-based control of both amplitude and phase of input signals that requires a power divider at the antenna inputs for splitting and phase adjusting the signal to be transmitted. Again, as the phase shifters are connected directly to the antenna only one polarization type is capable of reception and or transmission at any single instant in time in the system proposed in U.S. Pat. No. 4,737,793. Furthermore, the use of excessive processing on the signals at the antenna is undesirable, as the losses induced would be excessive and cause noise figure degradation of the receiver performance and an unacceptable loss on the PA output for transmission.

Thus, there is currently no known method of configuring an antenna polarization type using the same antenna element and supporting simultaneous reception modes of signals exhibiting different polarization types. Furthermore, the few known techniques in configuring an antenna polarization type utilize bulky radio frequency components, which add to the complexity, size and cost.

Consequently, current techniques are suboptimal. Hence, an improved mechanism to address the problem of supporting antenna array technology in a wireless communication network would be advantageous.

SUMMARY OF THE INVENTION

Accordingly, the invention seeks to mitigate, alleviate or eliminate one or more of the above mentioned disadvantages singly or in any combination.

According to a first aspect of the invention, a method for processing at least one polarization type of at least one wireless signal by a communication unit operably couplable to an antenna arrangement that comprises at least two orthogonally polarized antenna elements. The method comprises processing at least one signal radiated by at least one first antenna element of the antenna arrangement; and processing the at least one signal where processing comprises at least applying at least one digital complex scaling operation on the at least one signal radiated by at least one second antenna element of orthogonal polarization to the at least one first antenna element of the antenna arrangement thereby radiating at least one wireless signal of at least one non-native polarization type. The method further comprises providing a digitized feedback signal to a calibration controller representative of a coupled signal at an at least one antenna port of the antenna arrangement; and performing at least one from a group consisting of: phase correction, amplitude correction, latency correction, on the at least one signal radiated by the at least one antenna port to regulate at least, the at least one non-native polarization type. This advantageously allows more degrees of freedom in processing of various polarization types of receive and transmit wireless signals, whilst also allowing better integration options for such functionality According to an optional example embodiment of the invention processing may comprise modifying the at least one digital complex scaling applied to the at least one signal radiated by the at least one second antenna element to radiate a different polarization type, advantageously facilitating substantially instantaneous control of the polarization processing of wireless signals.

According to an optional example embodiment of the invention, processing the at least one signal radiated by at least one first antenna element of the antenna arrangement may comprise processing the at least one signal such that at least one further wireless signal of native polarization type is radiated by the at least one first antenna element advantageously facilitating at least two polarization type concurrently, one of which is native to the antenna elements.

According to an optional example embodiment of the invention, the native and non-native polarization types may comprise at least one of: a linear polarization type and a circularly polarization type, and/or may comprise at least one of: a left hand circularly polarization type and a right hand circularly polarization type and/or may comprise a polarization type from a group of: (i) a cross polarization type; (ii) a circularly polarization type; (iii) a linear polarization type; (iv) an elliptical polarization type, thereby advantageously allowing multiple polarization types to be configured and processed.

According to an optional example embodiment of the invention, processing may comprise concurrently processing a plurality of polarization types of at least one wireless signal, thereby advantageously allowing multiple polarization types to be configured and processed using the antenna arrangement and associated communications unit/element.

According to an optional example embodiment of the invention, the at least one signal processed by at least one signal radiated by the at least one first antenna element of the antenna arrangement and the at least one signal radiated by the at least one second antenna element of orthogonal polarization to the at least one first antenna element of the antenna arrangement may form at least part of the same signal or may be different signals, thereby advantageously allowing multiple polarization types to be configured and processed on different signals According to an optional example embodiment of the invention, processing the at least one signal radiated by the at least one second antenna element may comprise processing a modified version of the at least one signal radiated by the at least one first antenna element, thereby advantageously allowing multiple polarization types to be configured and processed on the same signals using a signal radiated from at least one antenna element and the signals modified version radiated from at least one second antenna element to create a polarization type.

According to an optional example embodiment of the invention, processing the at least one signal radiated by the at least one first antenna element may comprise processing a received wireless signal of a native polarization type and processing the at least one signal radiated by the at least one second antenna element may comprise processing a wireless transmit signal of the non-native polarization type, thereby advantageously allowing for different polarization types to be used in transmit and receive operation.

According to an optional example embodiment of the invention, the at least one first antenna element may be a different antenna element to the at least one second antenna element.

According to an optional example embodiment of the invention, the method may further comprise determining whether a signal level of a received wireless signal exceeds a threshold level; and selecting a polarization process type to be applied to the received signal based thereon. The method may further comprise applying a diversity process type in response to determining that the signal level of the received wireless signal exceeds the threshold level, thereby advantageously allowing for power saving features to be supported in a communications receiver.

In one example, providing the digitized feedback signal may comprise providing a digital feedback representing a plurality of coupled signals at the antenna port using a common path shared amongst a plurality of antenna elements of the antenna arrangement.

According to an optional example embodiment of the invention, the method may further comprise providing a digitized reception of a known signal polarization type that is propagated wirelessly to the antenna arrangement feedback to a calibration controller; and performing on the at least one signal in response thereto, at least one from a group of: phase correction, amplitude correction, latency correction.

According to an optional example embodiment of the invention, the method may further comprise providing a signal to a calibration controller operably coupled to a receiver; and performing on the at least one signal, at least one from a group of: phase correction, amplitude correction, latency correction.

According to an optional example embodiment of the invention, the method may further comprise receiving a wireless signal from at least one base station or the antenna arrangement; performing radio frequency conversion to down-convert the received wireless signal to a baseband calibration signal; performing analogue-to-digital conversion to convert the baseband signal calibration to a digitized calibration signal; and processing the digitized calibration signal. The method may further comprise performing active adjustment on a baseband signal in response to the processed baseband calibration signal to create a signal of a non-native polarization type at the second antenna element; performing digital-to-analogue conversion to convert the adjusted digitized signals to analogue signals; and up-converting the analogue signals to a wireless signal for forwarding to the second antenna element.

According to an optional example embodiment of the invention, the at least one first antenna element or the at least one second antenna element of the antenna arrangement may be a dual polarized patch antenna arranged to support a native linear polarization type According to an optional example embodiment of the invention, the method may further comprise routing a plurality of radio frequency signals to a plurality of cross polarized antenna elements via a coupler structure.

According to an optional example embodiment of the invention, applying digital complex scaling may comprise processing multiple baseband signals of multiple polarization types.

According to an optional example embodiment of the invention, applying digital complex scaling may comprise applying scaling to the at least one signal radiated by either of the first antenna element or second antenna element to form an elliptically polarized signal.

According to an optional example embodiment of the invention, the at least one antenna element may be located on one from a group of: a wireless subscriber device, a network infrastructure element.

According to an optional example embodiment of the invention, a plurality of antenna elements may form an active antenna array supporting dedicated signal processing per antenna array element.

According to an optional example embodiment of the invention, processing the at least one signal by applying at least one digital complex scaling operation on the at least one signal radiated by at least one second antenna element may comprise concurrently applying on the at least one signal at least one from a group of: beamforming, IQ imbalance correction, mismatch correction.

According to an optional example embodiment of the invention, the first signal of a native polarization type or the second signal of a non-native polarization type may be arranged to be consistent with at least one from a group of: 3rd Generation Partnership Project, 3GPP or any evolution of such a standard, wideband code division multiple access, WCDMA, communication; digital video broadcast communication; satellite-based communication.

According to a second aspect of the invention, a computer program product comprises program code for processing at least one polarization type of at least one wireless signal by a communication unit operably couplable to an antenna arrangement that comprises at least two orthogonally polarized antenna elements. The program code is operable for processing at least one signal radiated by at least one first antenna element of the antenna arrangement; and processing the at least one signal where processing comprises at least applying at least one digital complex scaling operation on the at least one signal radiated by at least one second antenna element of orthogonal polarization to the at least one first antenna element of the antenna arrangement thereby radiating at least one wireless signal of at least one non-native polarization type. The program code is further operable for providing a digitized feedback signal to a calibration controller representative of a coupled signal at an at least one antenna port of the antenna arrangement; and performing at least one from a group consisting of: phase correction, amplitude correction, latency correction, on the at least one signal radiated by the at least one antenna port to regulate at least, the at least one non-native polarization type.

According to a third aspect of the invention, a communication unit comprises an interface for coupling to an antenna arrangement that comprises at least two orthogonally polarized antenna elements. The communication unit further comprises a signal processor arranged to process at least one signal radiated by at least one first antenna element of the antenna arrangement; and process the at least one signal where the process comprises at least applying at least one digital complex scaling operation on the at least one signal radiated by at least one second antenna element of orthogonal polarization to the at least one first antenna element of the antenna arrangement thereby radiating at least one wireless signal of at least one non-native polarization type; provide a digitized feedback signal to a calibration controller representative of a coupled signal at an at least one antenna port of the antenna arrangement; and perform at least one from a group consisting of: phase correction, amplitude correction, latency correction, on the at least one signal radiated by the at least one antenna port to regulate at least, the at least one non-native polarization type.

According to a fourth aspect of the invention, an integrated circuit for a communication unit comprises an interface for coupling to an antenna arrangement that comprises at least two orthogonally polarized antenna elements. The integrated circuit further comprises a signal processor arranged to process at least one signal radiated by at least one first antenna element of the antenna arrangement; and process the at least one signal, where the process comprises at least applying at least one digital complex scaling operation on the at least one signal radiated by at least one second antenna element of orthogonal polarization to the at least one first antenna element of the antenna arrangement thereby radiating at least one wireless signal of at least one non-native polarization type; provide a digitized feedback signal to a calibration controller representative of a coupled signal at an at least one antenna port of the antenna arrangement; and perform at least one from a group consisting of: phase correction, amplitude correction, latency correction, on the at least one signal radiated by the at least one antenna port to regulate at least, the at least one non-native polarization type.

These and other aspects, features and advantages of the invention will be apparent from, and elucidated with reference to, the embodiments described hereinafter.

BRIEF DESCRIPTION OF THE DRAWINGS

Embodiments of the invention will be described, by way of example only, with reference to the accompanying drawings, in which.

DETAILED DESCRIPTION OF EMBODIMENTS OF THE INVENTION

Figure 1:
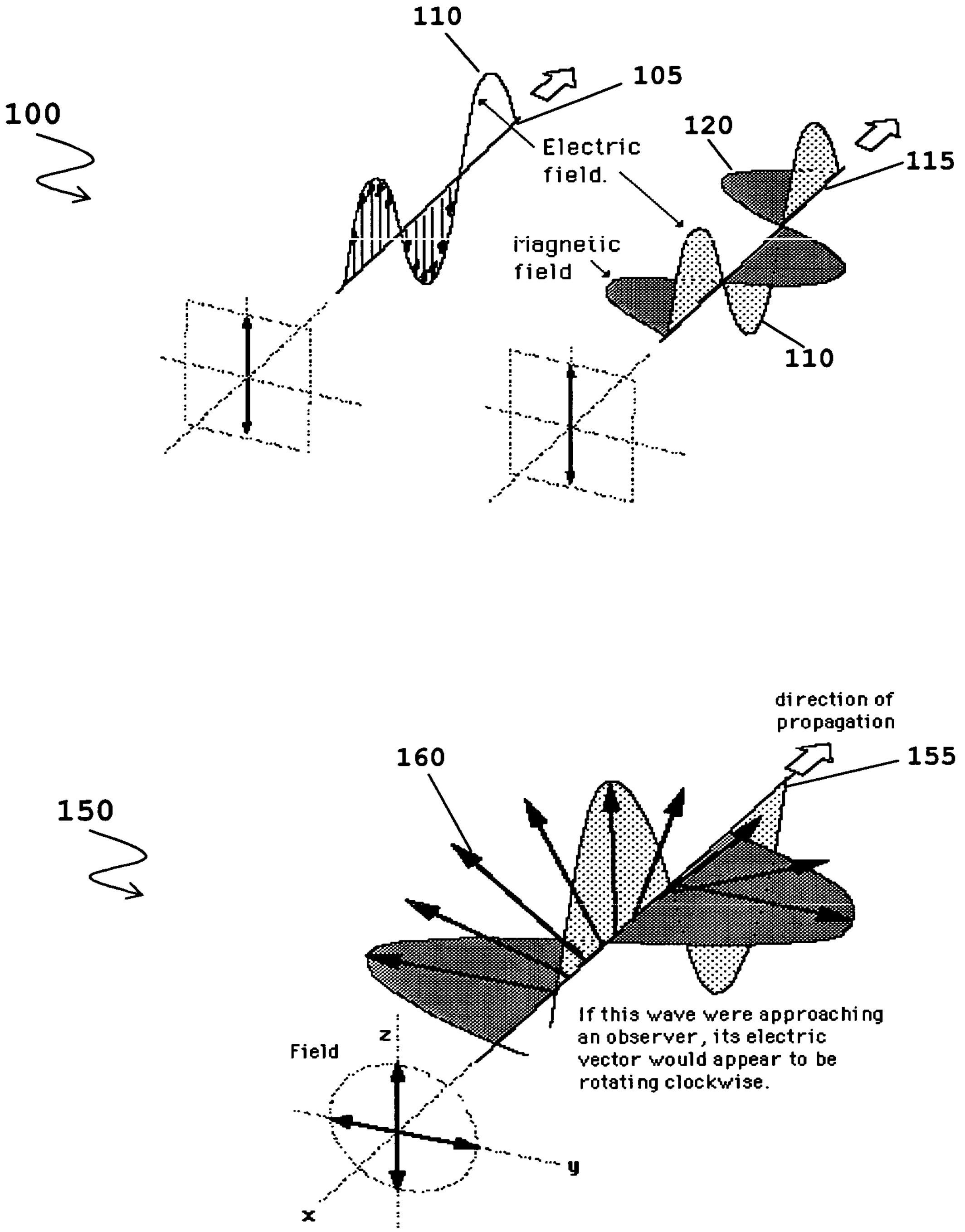
FIG. 1 shows electromagnetic waveforms illustrating a linear polarized field and a circular polarized field.

Embodiments of the invention are described with reference to smart (or active) antenna technology used in a wireless communication system. Since the invention can relate to any orthogonally polarized antenna arrangement, examples of the invention are equally relevant to UE or any handset receiver device. For the purpose of simplicity the following description will be explained with regard to a network element connected to an active panel antenna. Smart (or active) antenna technology is a radio technology where the antenna system comprises dedicated signal processing logic per antenna array element. Alternative embodiments may be employed in co-located antenna and signal processing units. Smart (active) antenna technologies fall into three broad families, namely: (i) multi-antenna systems (MAS); (ii) radiohead implementations with or without multiple in-multiple out (MIMO) radio ports; and (iii) active antenna arrays.

The following description focuses on embodiments of the invention that are applicable to active antenna arrays employed in Universal Mobile Telecommunication System (UMTS) cellular communication systems and in particular to a UMTS Terrestrial Radio Access Network (UTRAN) operating in a 3rd generation partnership project (3GPP) system, and evolutions to this standard such as HSPA+. However, it will be appreciated that the invention is not limited to this particular cellular communication system, but may be applied to any wireless communication system, including satellite communication systems, employing antenna arrangements, where at least one orthogonal pair of antenna elements are used.

Examples of the invention are described with reference to configuring and processing signals that are to be provided to or from one or more antenna elements arranged to provide various polarized radio frequency signals for various combinations of reception and transmission. The configuring of the signals is performed at low frequencies and in one preferred example at baseband using complex scaling functions on the digitized baseband signals. Such baseband configuring of signals to provide polarization control of radio frequency signals is in contrast to the known technique of configuring radio frequency signal processing components to support polarization control.

In this manner, by use of complex scaling functions on the digitized baseband signals, in order to provide polarization control of radio frequency signals, it is possible to actively adapt the complex scalar values to correct for any mismatches of phase and/or amplitude as processed through the independent RF paths fed to/from the orthogonal pair(s) of antenna elements. Rather than process a live receive signal as a means to attempt to optimise a phase shift of an electromechanical, or varactor-based, radio frequency phase shifter element, as proposed in WO/2000/001033, a more efficient means of controlling the polarization is shown.

Furthermore, by use of complex scaling functions on the digitized baseband signals in order provide polarization control of the radio frequency signals it is possible to switch substantially immediately between different polarization types, thereby avoiding being impacted by settling time issues in employing a closed loop receiver tracking system proposed in WO/2000/001033.

Advantageously, examples of the invention use complex digitized baseband signals in order to provide polarization control of radio frequency signals, in order to concurrently support multiple receiver polarization types. Such techniques cannot be supported using the techniques proposed in the known prior art, such as WO/2000/001033, as the feed line to the antenna elements contains all the polarization control functionality, which is common to all signals to be processed by the antenna arrangement. Furthermore, since all the signals are duplicated in the digital domain for separate processing, there is no impact on receiver noise performance. Such duplication or splitting of the signal, if performed at the antenna elements, would have a detrimental impact on receiver performance.

A yet further advantage of using complex digitized baseband signals in order provide polarization control of radio frequency signals enables the transmit path and the receive path to be readily and independently adjusted with regard to the polarization type being used, rather than the restrictions imposed through the use of a complex radio frequency phase shifter topology as proposed in WO/2000/001033.

In the described examples, a reference to a native polarization of an antenna encompasses the polarization of a signal processed by one antenna element acting independently of another antenna element. In the XPOL example cited heretofore the native polarization would be LP +45° and LP −45°. Independent signals processed by these antenna elements will undergo no polarization transformation. When a modified version of the same signal is processed concurrently in antenna elements of both polarizations, and through combining forms a different polarization type, then this is referred to as non-native.

Figure 2:
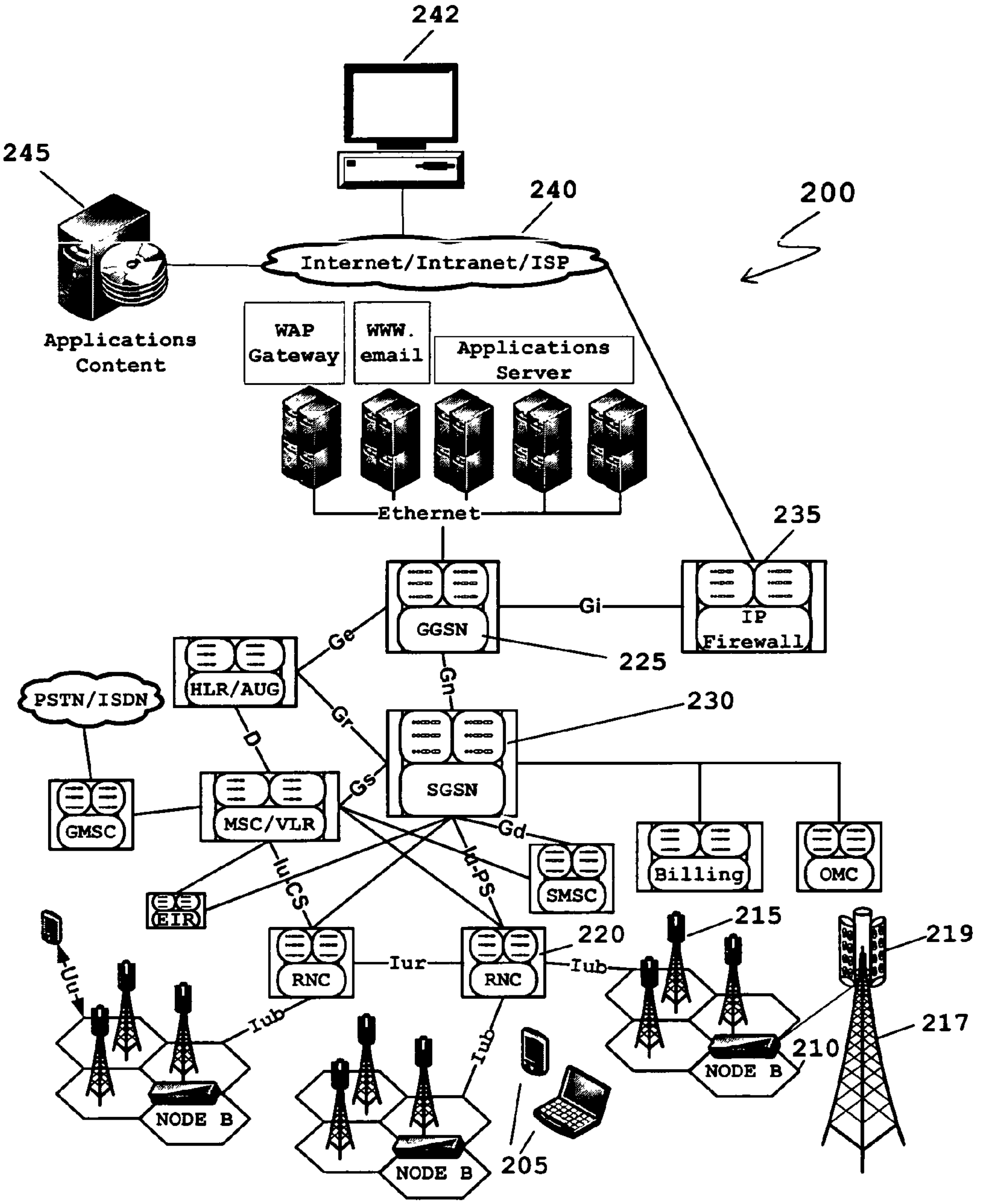
FIG. 2 illustrates an example of a 3GPP cellular communication system adapted in accordance with some embodiments of the invention.

Referring now to FIG. 2, a cellular-based communication system 200 is shown in outline, in accordance with one embodiment of the invention. In this embodiment, the cellular-based communication system 200 is compliant with, and contains network elements capable of operating over, an universal mobile telecommunication system (UMTS) air-interface or any evolution of said air interface access method.

A plurality of wireless subscriber communication units/terminals (or user equipment (UE) in UMTS nomenclature) 205 communicate over radio links with a plurality of base transceiver stations, referred to under UMTS terminology as Node-Bs, 215 supporting communication coverage over a particular communication cell 210. The system 200 comprises many other UEs and Node-Bs, which for clarity purposes are not shown.

The wireless communication system, sometimes referred to as a Network Operator's Network Domain, is connected to an external network 240, for example the Internet. The Network Operator's Network Domain includes:

(i) A core network, namely at least one Gateway General Packet Radio System (GPRS) Support Node (GGSN) 225 and at least one Serving GPRS Support Nodes (SGSN) 230; and (ii) An access network, comprising a UMTS Radio network controller (RNC) 220; and at least one UMTS Node-B 215, where each RNC 220 may control one or more Node-Bs 215.

The GGSN 225 or SGSN 230 is responsible for UMTS interfacing with a Public network, for example a Public Switched Data Network (PSDN) (such as the Internet) 240 or a Public Switched Telephone Network (PSTN). The SGSN 230 performs a routing and tunneling function for traffic, whilst a GGSN 225 links to external packet networks. Each SGSN 230 provides a gateway to the external network 240. The Operations and Management Centre (OMC) is operably connected to RNCs 220 and Node-Bs 215. The OMC comprises processing functions and logic functionality in order to administer and manage sections of the cellular communication system 200, as is understood by those skilled in the art.

The Node-Bs 215 are connected to external networks, through Radio Network Controller (RNC) stations, including RNC 220 and mobile switching centres (MSCs), such as SGSN 230. A cellular communication system will typically have a large number of such infrastructure elements where, for clarity purposes, only a limited number are shown in FIG. 2.

Each Node-B 215 contains one or more transceiver units and communicates with the rest of the cell-based system infrastructure via an lub interface, as defined in the UMTS specification. Each Node-B 215 is operably coupled to an antenna mast 217 for transmitting and receiving signals to/from remote UEs, where each antenna mast 217 comprises an antenna array 219 adapted in accordance with embodiments of the invention.

In accordance with embodiments of the invention, active array technology is employed in the cellular communication system 200. In contrast to the known art, embodiments of the invention provide a mechanism to dynamically adapt an antenna array to support multiple configurable polarization types. In particular, a communication unit in a form of a network element, for example to be located between a Node B 215 and the antenna array 219, or in a form of a UE 205 may be adapted to improve a processing overhead of signal reception in strong signal conditions.

Modern air-interface protocols exploit antenna diversity to improve the air interface communication link. Thus, conventional antenna arrangements, and particularly antenna arrays contain an array of radiative antenna elements of +45° and −45° orthogonal polarization. Prior to the demodulation process received signals are generally processed independently. Since these are diverse paths, phase coherency will be uncontrolled and in many cases will not exist. Therefore, if the diverse paths are added, a 3 dB increase in noise may result. Therefore, the signals are not usually combined in the RF domain. Generally, in legacy network configurations, it is sufficient to transmit in one polarization type only. Hence, transceiver circuits are typically connected to antenna elements of one polarization type only and receive diversity paths are processed independently.

Cross polarized (XPOL) antennas are used in many instances of wireless communications. The XPOL antennas support the reception of wireless (radio frequency) from a UE communication unit that has a linear polarized (LP) antenna, but where the antenna's orientation to the earth's surface is unknown. As such, XPOL antennas at the Node-B are capable of receiving the signal, irrespective of the UE orientation. The received signals are generally not added at the antenna, nor are they added in the receive processing chain of the communication unit. A maximum-ratio combiner (MRC) module is generally employed to add the signals prior to final demodulation. This process involves estimating the signal level of each individual UE and proportionally adding the signals proportional to the signal level received for each polarization.

Addition of signals from XPOL antennas may not always be optimum in the RF domain, at least from a noise perspective. Furthermore unless the phase of these signals is carefully controlled the respective signals from the XPOL antenna elements cannot be added in an efficient manner. For example, such a case would exists where a communication unit (UE) has a HP transmit antenna, and the node B has XPOL receive antenna elements at +45° and one XPOL receive antenna at −45°. With such an antenna arrangement, half a received signal power will be received by both antenna XPOL elements. Also, with such an antenna arrangement, when the received signals are added coherently, the signal power will increase by 6 dB and the noise power will only increase by 3 dB. This results in a net gain, when added, of 3 dB SNR. However, in a second case, where the UE communication unit has a HP transmit antenna, and the node B has one XPOL receive HP antenna at 0° and one XPOL receive VP antenna at +90°, no receive power will be detected by the VP antenna element(s) due to the orthogonal polarization with the UE antenna. Thus, all received signal power will appear on the XPOL HP antenna element(s). Thus, when the two signals are added there will be a 3 dB increase in noise (assuming common independent noise in both receive paths) and 0 dB increase in signal level. This results in a net loss of 3 dB SNR.

At low receive signal levels, such a loss is significant, whereas when the signal is of a sufficient level above the noise floor of the receiver there is no appreciable change in bit error rate (BER). For example, from a signal quality perspective, there is negligible difference in, say, receiving a signal with 26 dB SNR and receiving a signal with 23 dB SNR. Thus, in high signal level reception, the inventors have recognised and appreciated that hardware used for circular polarized (CP) reception of signals would suffice for addition of the signals in this mode. In switching to this reception, the receiver of the communication unit is able to disable processing functions that support diversity reception. Particularly in the context of mobile communication units, this mode of operation advantageously reduces power consumption of the communication unit. Therefore, in one example described below with respect to FIG. 8, a mechanism to switch between polarization types is employed, where such a switching operation is linked to a received signal power level. In accordance with an example embodiment of the invention a method of combing these signals prior to demodulation processing is shown. The phase coherency of the received signals may be controlled with the CP hardware generation circuits. Furthermore, with knowledge of the magnitude of a received signal it is possible to add the extra noise without detrimentally impacting performance of the receiver.

In one example embodiment of the invention, a switched coupler network is used to support a routing of different signals to/from respective antenna elements, for example within an antenna array. Advantageously, the switched coupler network may be used to support calibration of RF and baseband signal processing path mismatches needed to maintain accurate control of the desired polarization, or of the multiple concurrent polarization types on antenna elements for both receive and transmit operations.

In another example embodiment of the invention it may be desirable to achieve calibration of the antenna array by utilizing a known calibration transceiver in the field of known polarization types. This can be used to estimate the generation of correction coefficients used in the calibration.

Figure 3:
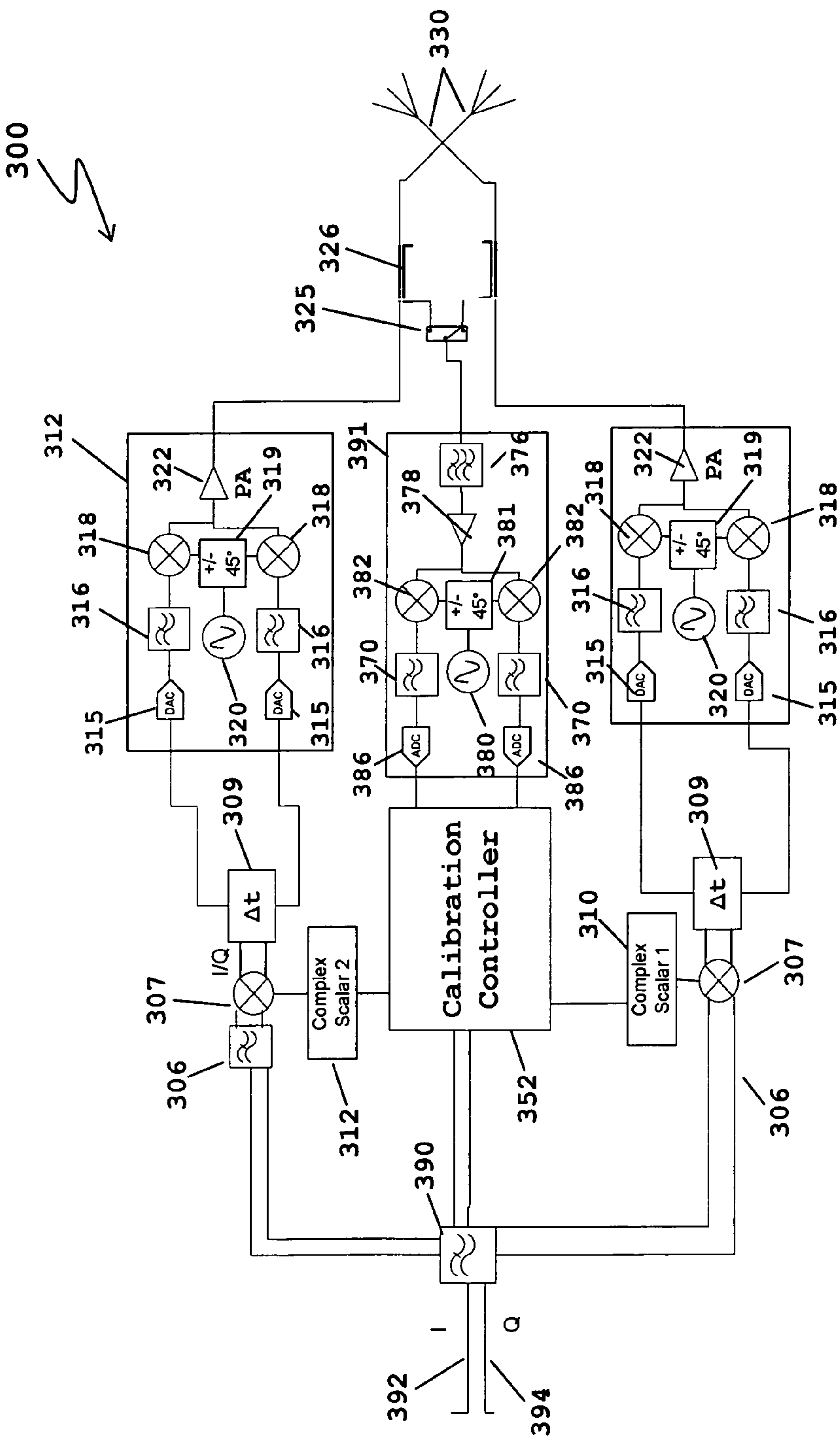
FIG. 3 illustrates an example of a part of a communication unit arranged to support multiple polarization types in a transmit-only mode of operation.

Referring now to FIG. 3, an example of a part of a communication unit 300 arranged to support multiple polarization types in a transmit-only mode of operation is illustrated in accordance with embodiments of the invention. In this example embodiment the communication unit 300 comprises cross polarized (XPOL) antenna elements that are of an orthogonal polarization linear type employing both +45° and −45°, with respective independent transmit antenna paths connected to each port of the antenna element. One example embodiment, when the communication unit is employed as a network element coupling a base station to an antenna arrangement, utilizes an OBSAI RP3 01 or CPRI interface (not shown) for interfacing to a baseband processing unit of a cellular base station, such as a 3GPP Node B. The Node B base band performs demodulation and modulation encoding. The node B also interfaces with RNC to supply back haul communication to the rest of the network and wider communication infrastructure. Thus, example embodiments of the invention propose a communication unit 300 to be located adjacent an antenna arrangement, such as antenna array 330 where the communication unit 300 functions as an intermediary digital active adaptive antenna array system between the antenna array 330 and the Node B (not shown). In one example, the communication unit 300 may be configured for active control from, say, a modem. In an alternative example, the communication unit 300 may form part of a wireless subscriber unit, such as a user equipment (UE) in 3GPP parlance.

The embodiment illustrated in FIG. 3 relates to a transmitter antenna arrangement and associated conversion allowing digital processing. Example embodiments of the invention utilize a plurality of parallel transceiver paths, equivalent to a number of antenna elements used. In one example embodiment, a further transceiver path may be included to provide a dedicated common calibration transceiver path.

The communication unit 300, e.g. an RF transmit subsystem of a communication network element or broadcast transmitter, comprises a plurality of parallel transmitter circuits operably coupled to an antenna arrangement 330. The transmit modules 312 are also operably connected to the antenna arrangement 330, as shown.

IQ sample pairs are input to the digital signal processing chain and filtered in low pass filters 306 for each of the individual transmission path, as well as providing a reference to the calibration controller 352. In accordance with examples of the invention, complex scaling modules 307 apply one or more complex scalar values stored in one or more memory modules 310, 312 to each of the respective ‘I’ and ‘Q’ pair baseband signals to accommodate for the polarization type being used in the transmit operation. A complex scalar (sometimes referred to as complex multiplier) consists of a module where for each complex IQ sample, the module multiplies the IQ sample by another complex term in a form, such as $\{(I+jQ)\times(Z+jY)\}$, where the resultant is another complex number. The letter “j” is used to denote the complex number operator.

In a first example implementation, complex scaling modules 307 are configured to apply complex signal adjustment of the baseband IQ sample pairs to produce circular polarized (CP) signal generation at the respective antenna arrangement. In producing CP signals, it is desirable to have substantially 90° offset between antenna ports and substantially equal magnitude. Any mismatch error and the corresponding 90° phase offset is accommodated in the complex scalar values stored in one or more memory modules 310,312 applied to the respective signals via the complex scalar modules 307.

In a second example implementation, complex scaling modules 307 are configured via complex scalar values stored in one or more memory modules 310, 312 to apply complex signal adjustment of the baseband IQ sample pairs to produce left hand circular polarized (LHCP) and right hand circular polarized (RHCP) signals by changing the XPOL port lead, or lag, by 90° with respect to the other.

In a third example implementation, complex scaling modules 307 are configured via complex scalar values stored in one or more memory modules 310, 312 to apply complex signal adjustment of the baseband IQ sample pairs to produce a linear polarized (LP) signal for the transmitter where just one of the complex scalar values is set to be 0+j0 where j is the complex operator. In this example, one transmitter is turned off whilst the other port is fixed at, for example, 1+j0 thereby maintaining a unity gain amplitude scaling on that path. Thus, dependent upon which transmit path is selected and switched to the antenna element, a LP signal can be generated.

In accordance with one example, complex scaling modules 307 may additionally apply complex scalar values stored in one or more memory modules 310, 312 to each of the respective ‘I’ and ‘Q’ baseband signals, taking into account relative phase, amplitude relationship to each of the antenna elements as determined by calibration controller 352. Latency or time mismatches on the paths may also be calibrated via delay adjustment module 309. Where applicable, a plurality of XPOL element pairs can be arranged in an array, multiple antenna element transmit signal processing functions can be performed in parallel to provide beamforming and polarization control, where only one dual transmit operation is indicated in FIG. 3 for simplicity purposes only.

Each of the plurality transmitter circuits 312 comprise digital to analogue conversion modules, 315, to generate complex baseband analogue signals. The analogue signals are filtered, 316, and frequency translated, 318, to the desired RF band. A quadrature phase shifter 319 ensures that the quadrature baseband signals are up-converted to radio frequency signals correctly. These RF signals are amplified in power amplifier, 322. Once amplified, the RF signals are routed to the antenna elements 330 via a coupler structure 326, for example as described in FIG. 7.

In the illustrated transmit only mode of operation, a calibration feedback path is provided using the coupler structure 326. A switch 325 is placed on the feedback path, such that a single detection path can be used for both transmitters. The calibration feedback path is arranged to provide detection of phase, amplitude and/or latency mismatch of the transmitted signals. An example of the mechanism to detect and calculate an amount of phase, amplitude and/or latency mismatch of the transmitted signals is described in a co-pending Patent Application GB0902410.0 by the same applicant, the mechanism of which is incorporated herein by reference.

The coupler structure 326 is operably coupled via a switch 325 to a calibration feedback detection receiver 391 consisting of a band-pass filter 376, an optional low noise amplifier 378, down-conversion stages 382 arranged to down-convert the respective amplified received signals based to a frequency down-conversion signal. Down conversion signals are fed in quadrature format from a local oscillator generation subsystem 380, 381. The respective quadrature down-converted amplified received signals are input to respective low-pass filters 370 and thereafter to respective analogue-to-digital converters 386 to transform the quadrature down-converted received signal to a digital form and passed to calibration controller 352.

The calibration controller 352 is configured to detect a phase, amplitude and latency mismatch between each transmit path with respect to the desired signal response. In one example embodiment, the calibration controller 352 is run intermittently, as changes in path latency phase and amplitude response are slow changing phenomena.

Notably, in accordance with embodiments of the invention, polarization processing, and particularly accurate polarization processing involves application of phase, amplitude and latency scaling of each individual transmit signal.

Each of the plurality of parallel baseband transmitters comprise respective logic arranged to process baseband signals to ensure accurately polarized RF signals at respective antenna elements.

Thus, in accordance with one example of the invention, a common digital IQ sample baseband signal is fed to both transmitters, having being channel filtered in filters 306. The IQ sampled signal is independently scaled via complex scalar modules 307 using complex scalar values stored in one or more memory modules 310, 312 in order to achieve the desired amplitude and phase of the RF signals at the antenna elements. The complex scalar values stored in one or more memory modules 310, 312 applied to the complex scalar modules 307 is determined by the polarization mode desired of the transmitter and a result of the calibration mismatch detection process, performed by the calibration controller 352.

In one example embodiment, the calibration controller 352 is further arranged to process the fed back signals to determine whether any phase, amplitude and/or latency scaling of each individual transmit signal is also required, and if so to effect such a further complex scalar (or latency) adjustment. In accordance with example embodiments of the invention, the calibration controller logic 352 also controls the routing of RF signals within the coupler structure 326, with an array example further described with reference to FIG. 7.

It is envisaged that power management functions and clock generation functions may be used, but are not shown in the diagrams for the sake of simplicity.

Figure 4:
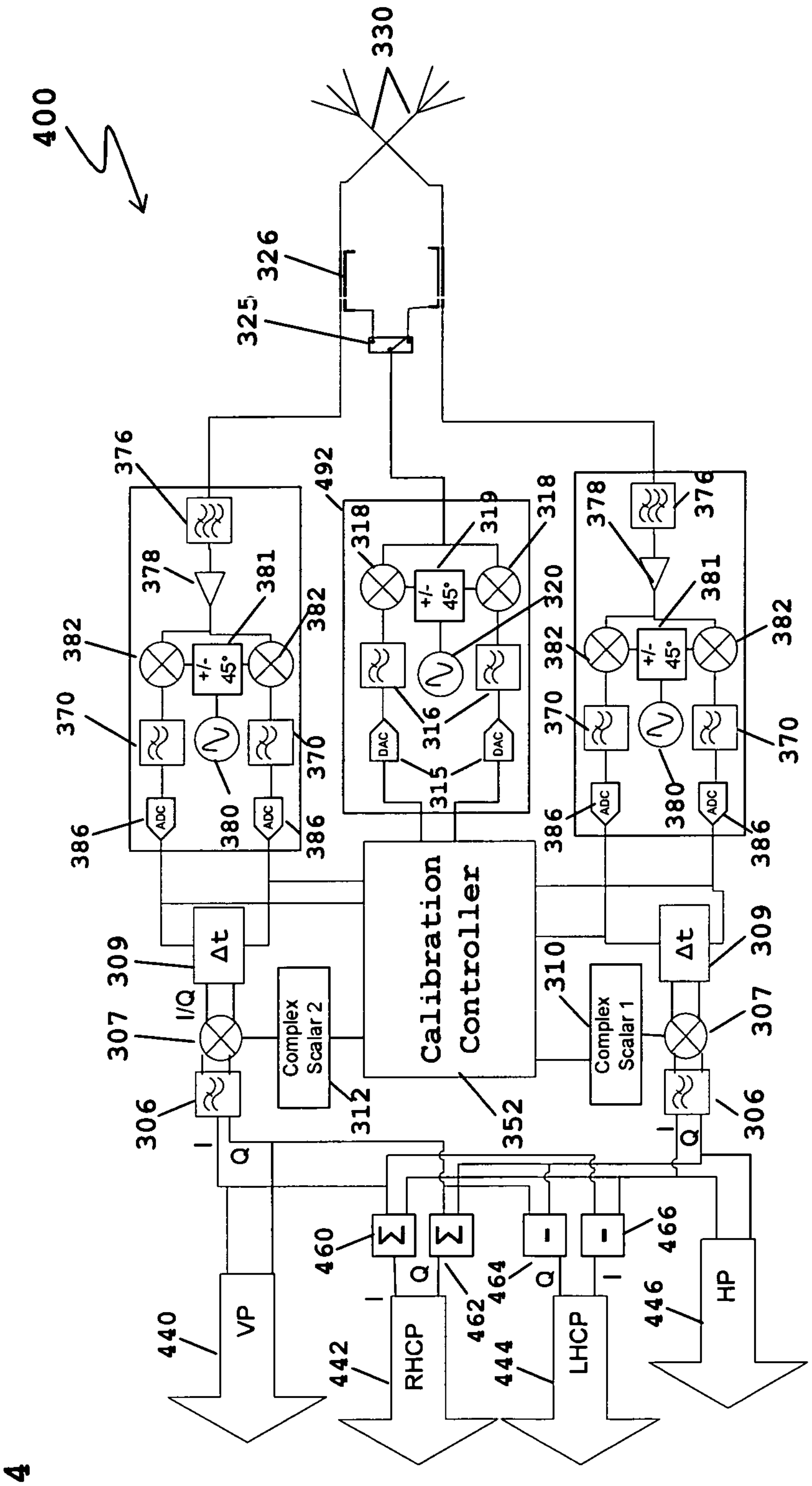
FIG. 4 illustrates an example of a part of a communication unit arranged to support multiple polarization types in a receive-only mode of operation.

Referring now to FIG. 4, an example of a part of a communication unit 400 arranged to support multiple polarization types in a receive-only mode of operation is illustrated. In this example embodiment the communication unit 400 comprises a cross polarized (XPOL) antenna arrangement, employing both +45° and −45° and has an independent receiver connected to each antenna port. Again, one example embodiment, when the communication unit is employed as a network element coupling a base station to an antenna arrangement, utilizes an OBSAI RP3 01 or CPRI interface (not shown) for interfacing to a baseband processing unit of a cellular base station, such as a 3GPP Node B. The Node B baseband performs demodulation and modulation encoding. The node B also interfaces with RNC to supply back haul communication to the rest of the network and wider communication infrastructure. Thus, example embodiments of the invention propose a communication unit 400 to be located adjacent an antenna arrangement, such as an antenna array 330 where the communication unit 400 functions as an intermediary digital active adaptive antenna array system between the antenna array 330 and the Node B (not shown). In one example, the communication unit 400 may be configured for active control from, say, a modem. In an alternative example, the communication unit 400 may form part of a wireless subscriber unit, such as a user equipment (UE) in 3GPP parlance.

The example embodiment illustrated in FIG. 4 employs control and selection of polarization types using at least two antenna elements in an antenna arrangement 330. An array of XPOL elements could also be considered, but is not shown for simplicity purposes only. Such an array may be arranged to have an individual receiver per element, or could be arranged as a number of ganged elements of common polarization, operably coupled to a single receiver pair.

The embodiment illustrated in FIG. 4 utilizes a plurality of receiver paths, equivalent to the number of antenna elements in the antenna arrangement. In one example embodiment, a further transceiver path may be included to provide a dedicated common calibration transceiver path.

The communication unit 400 comprises a plurality of parallel receiver circuits operably coupled via a number of transmission lines through the coupler structure 326 to at least one pair of cross polarized antenna elements 330. In the illustrated receive-only mode of operation, a calibration signal generation path is provided to operably couple to the coupler structure 326 via the switch network 325. The coupler structure 326 is employed to provide a calibration stimulus signal injection mechanism to the receive signal processing path under calibration. A switch 325 is located on a stimuli insertion path, such that a single calibration stimulus generation path can be used for both receivers. A single stimulus path with a switch advantageously avoids a use of duplicated stimulus paths and therefore avoids a duplication of hardware. Furthermore, the use of a common stimulus path allows a phase and amplitude response difference between both receive paths to be determined. The function of the calibration controller 352 is a detection of phase, amplitude and/or latency mismatch of the receive path processing each signal, and correction thereof via the complex scalar values stored in memory modules 310, 312 applied to the complex scalar modules 307.

The coupler structure 326 is operably coupled via a switch 325 to a signal generation circuit 492. The signal generation circuit 492 comprises quadrature signals that are input to digital-to-analogue conversion modules, 315, arranged to generate complex baseband analogue signals. The baseband analogue signals are filtered, 316, and frequency translated, 318, 320, to the desired RF band. A quadrature phase shifter 319 ensures that the quadrature baseband signals are up-converted to radio frequency signals correctly.

In examples of the invention, the digitized form of the received signals is input to delay adjust elements 309 and thereafter to respective complex scaling modules 307 often referred to as complex multipliers. In addition, the received signals are input to calibration controller 352. Calibration controller 352 utilizes the received quadrature signals from each respective receiver to generate polarization calibration correction coefficients. The polarization calibration correction coefficients are used in the determination of complex scalar values stored in one or more memory modules 310, 312 used by the complex scaling modules 307 to ensure accurate processing of the polarized, down-converted signals. In this regard, an intentional 90° phase rotation is also applied to one of the receive paths, as previously described with respect to the transmit case of FIG. 3.

Notably, in accordance with some examples, polarization processing, and particularly accurate orthogonal polarization processing involves application of phase, amplitude and latency scaling of each individual receive signal. Thus, the complex scalar values stored in one or more memory modules 310, 312 provide the respective polarization rotation and scaling, plus the application of calibration correction coefficients to the respective complex scaling modules 307. The respective adjusted received complex signals are filtered in low-pass channel filters 306. Without further processing, these signals may be used as LP diverse receive signals. In this case the signals may for example be +45° and −45° orthogonal polarized signals or vertical polarized (VP) and horizontally polarized (HP) signals, depending on the orientation of the antenna elements with respect to the surface of the earth.

In accordance with one example embodiment, complex scalar values stored in one or more memory modules 310, 312 are applied to the complex scaling modules 307, the complex scalar values stored in one or more memory modules 310, 312, when determined, take into account relative phase and amplitude relationship of the receiver paths to the antenna elements, as determined by calibration controller 352. Thus, the calibration controller 352 performs a phase and/or amplitude mismatch calculation and correction calibration measurement as well as correcting any latency mismatch between the receiver paths. Without calibration, the mismatch between signal processing paths would dominate the performance of the polarization adjustment. Again, in a similar manner to the aforementioned transmit case, calibration may be performed infrequently, as changes to path mismatches are a slow changing phenomena. Thus, receive calibration coefficients are also applied to complex scaling modules 307, in addition to polarization calibration coefficients (in order to accurately correct the receive signals for accurate polarization).

In one example, the respective adjusted, filtered, signals are used with an antenna arrangement that is XPOL with vertically polarized and horizontally polarized elements. In an additional or alternative example, once the 90° and calibration correction factors adjustments is applied to the received signals, the respective adjusted, filtered, quadrature signals are applied to summing modules 460, 462 and subtraction modules 464, 466, whose outputs provide a right hand circular polarized (RHCP) representation of the received signal 442 and a left hand circular polarized (LHCP) representation of the received signal 444, as shown. Here, a LHCP signal may be derived by generating a difference of the signals, where a subtraction is equivalent to adding a 180° (inversion) onto the receive paths (noting that there is already a phase shift of 90°, which would equate to a −90° corresponding to that required for LHCP).

In addition to the receiver circuits, a calibration signal generation circuit is included to enable the calibration controller 352 to determine the calibration correction coefficients. The calibration signal generation circuit is used to generate a reference for the receiver under test, so that the calibration controller 352 is able to determine any receiver path mismatch. The calibration signal generation circuit comprises quadrature signals input to digital to analogue conversion modules, 315, to generate complex baseband analogue signals. The analogue signals are filtered, 316, and frequency translated, 318, to the desired RF band. A quadrature phase shifter 319 ensures that the quadrature baseband signals are up-converted to radio frequency signals correctly. These RF signals are routed to the feed path to antenna elements 330 via a coupler structure 326, for example as described in FIG. 7.

Thus, in examples, one, two or all four polarization types can be accommodated. Furthermore, in some examples, it is possible to switch between polarization types dynamically. In further examples, it is possible to process multiple polarization types concurrently.

In additional example embodiments the use of a calibration signal generation circuit may be negated, or bypassed, if there is a known signal polarization type that is propagated in a wireless fashion to the antenna. In one example embodiment, this known calibration reference path may be a pilot beacon that could be sent by a fixed polarization transmitter. This can be used by the calibration controller to generate phase amplitude and or latency mismatch of the particular processing paths from the antenna elements.

In some reception modes it is envisaged that it would be useful to receive simultaneously more than one channel and using more than one polarization type. A typical application where multiple channels employing multiple polarization types would include digital video broadcast satellite services to handheld (DVB-SH) receivers. The DVB-SH standard dictates that receivers are required to receive RHCP signals from Satellite broadcast and they must also be capable of receiving VP signals transmitted from terrestrial broadcast transmitters.

One approach to possibly solving the DVB-SH problem of supporting more than one channel and using more than one polarization type is to duplicate the hardware circuits and use separate antenna elements. However, such an approach is size prohibitive, costly and complex. A second approach to possibly solving the DVB-SH problem of supporting more than one channel and using more than one polarization type is to use a single antenna element and accept the significantly compromised system level performance. From a commercial perspective, both approaches are unsatisfactory.

The DVB-SH standard proposes to utilize S-Band frequency reception band from 2170 MHz to 2200 MHz. Inmarsat™ and Solaris™ hold licenses for 15 MHz each of this S-Band spectrum, which have been allocated for DVB-SH services in Europe. The DVB-SH standard dictates receiving (and optionally concurrently) transmitting data to a geo-stationary satellite using RHCP. It is also planned that satellite coverage will be augmented by terrestrial broadcast using VP for enhanced coverage in urban regions. Thus, receivers are required to receive simultaneously two receive channels at different polarization types. The two channels of reception would be within the 15 MHz of allocated spectrum given to either of the license holders.

Furthermore, it is known that the downlink (DL) band allocated for 3GPP WCDMA operation, is Band I (operating at frequencies of 2110 MHz to 2170 MHz). This band is adjacent the allocated DVB-SH S-Band. Therefore, in accordance with one example implementation of the present invention, a common antenna arrangement is proposed that is configurable for a mobile communication unit to operate across both spectrum allocations and therefore concurrently receive 3GPP WCDMA and DVB_SH signals. In this example, the known requirement to utilize separate devices for the two technologies, is avoided. In turn, the proposed arrangement avoids incurring the consequent increase in cost, size and radio frequency performance requirements of the mobile communication unit.

Figure 5:
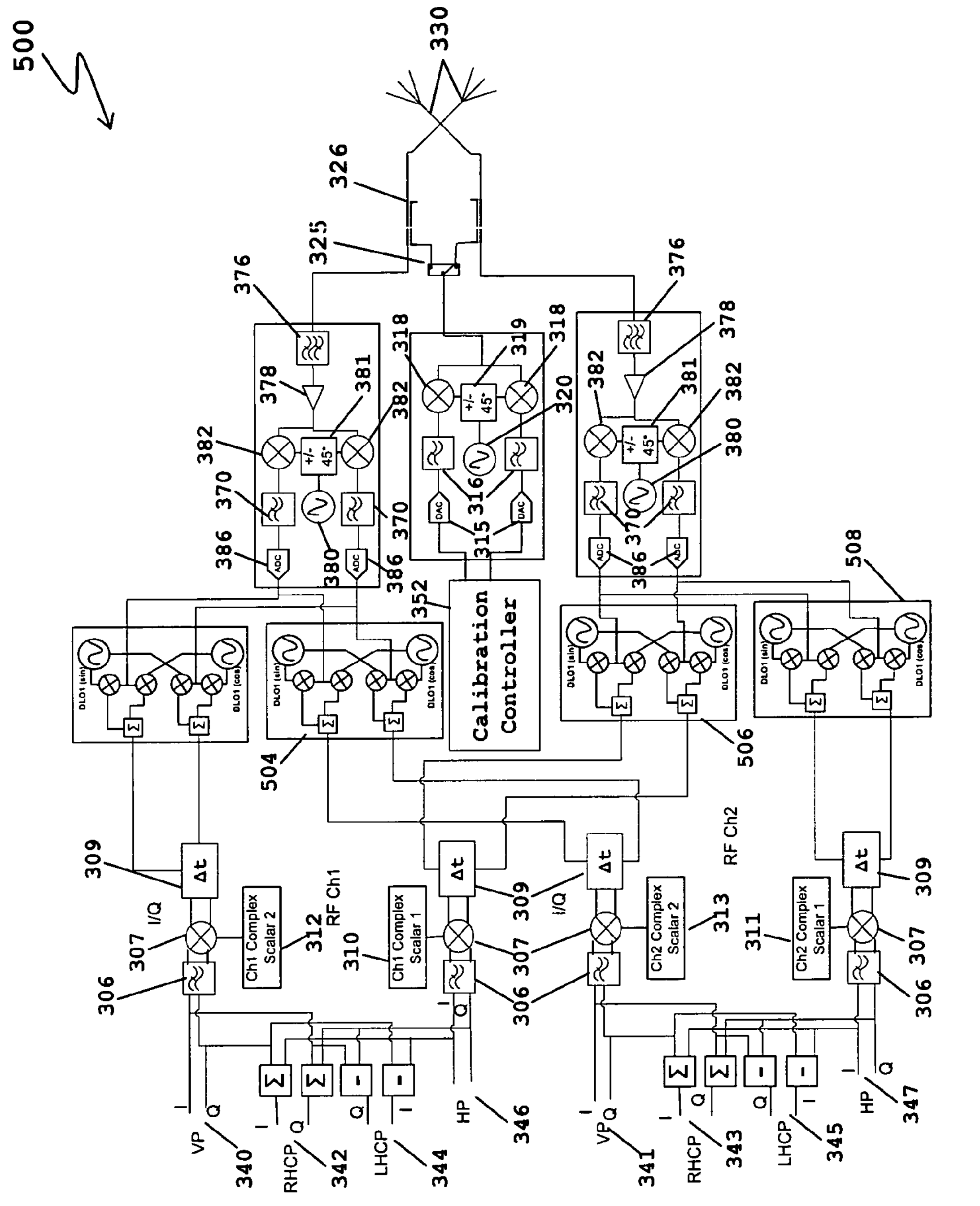
FIG. 5 illustrates an example of a part of a communication unit arranged to support multiple polarization types in a multi channel receiver arrangement.

Therefore, referring now to FIG. 5, an example of a part of a communication unit 500, such as part of a wireless subscriber unit, arranged to support multiple polarization types in a multi channel receiver arrangement is illustrated. Again, in this example embodiment the communication unit 500 comprises a cross polarized (XPOL) antenna element, employing for example both +45° and −45° orthogonal antenna elements and has an independent receiver connected to each antenna port. The communication unit 500 comprises a plurality of receiver circuits operably coupled via a number of transmission lines through the coupler structure 326 to the cross polarized antenna elements, which in one example form part of an antenna array 326. The operation of the calibration controller 352 may be the same as that described with respect to FIG. 3, and as such the description of its operation will not be replicated here.

Each receiver circuit is operably coupled, via the coupler structure 326, to a XPOL antenna element that is capable of receiving LP diversity signals for DVB-SH reception. The coupler structure 326 provides, in a receive mode, received signals to respective low-noise amplifiers (LNA) 378 via bandpass filters 376. The LNAs 378 provide amplified versions of the received signals to respective quadrature ('I' and 'Q') down-conversion stages 382 arranged to down-convert the respective amplified received signals based to a frequency down-conversion local oscillator signal. Down conversion local oscillator signals are fed in quadrature format from local oscillator generation sub-systems 380, 381. The respective quadrature down-converted amplified received signals are input to respective low-pass filters 370 and thereafter to respective analogue-to-digital converters 386 to transform the quadrature down-converted received signal to a digital form.

In this DVB-SH example, the entire 15 MHz of signal bandwidth is digitized. Image Cancelling mixers 502, 504, 506, 508 are employed to convert two of the RF channels to signals centred about DC. The image cancelling mixers 502, 504, 506, 508 require a high degree of IQ balance for best image cancelling results, which is provided through calibration controller 352. Known techniques for correction functions, in creating the improvement of IQ balance are not explained in any greater extent than that considered necessary, in order not to obfuscate or distract from the teachings of the present invention. Furthermore, known techniques for DC offset removal, following the ADC stage, are also employed and are not explained in any greater extent than that considered necessary, in order not to obfuscate or distract from the teachings of the present invention.

Once each of the signals has been down converted to a quadrature baseband signal centred around DC centred by a respective image cancelling mixer 502, 504, 506, 508, the quadrature baseband signals have the latency mismatch correction applied using variable delay module 309 and controlled by calibration controller 352, as described previously. Furthermore, the quadrature baseband signals are subjected to a phase and/or amplitude correction (if required) can be applied with some modification in complex scaling modules 307 by the complex scalar values stored in one or more memory modules 310, 311, 312, 313, as described previously. A 90° phase shift with respect to the other is also applied to one of the paths, per receiver, at this point. The corrected quadrature baseband signals are further channel filtered using respective low pass filters 306 in order to eliminate any unwanted out of channel noise and interference.

The filtered corrected quadrature baseband signals may then be used as polar diverse signals, e.g. VP signals 340, 341 or HP signals 346, 347. Alternatively, the filtered corrected quadrature baseband signals may be combined, as described previously, to form RHCP and LHCP diversity signals, 342, 343, 344, 345. In this manner, different antenna polarization types may be selected on an RF channel basis. In one example, not all polarization types for each down converted carrier frequency may be presented for baseband processing in order to reduce power consumption. For example, dependent upon the particular operating conditions, or the application being performed, the calibration controller may select variations of CP and/or LP modes of operation per receiver.

Figure 6:
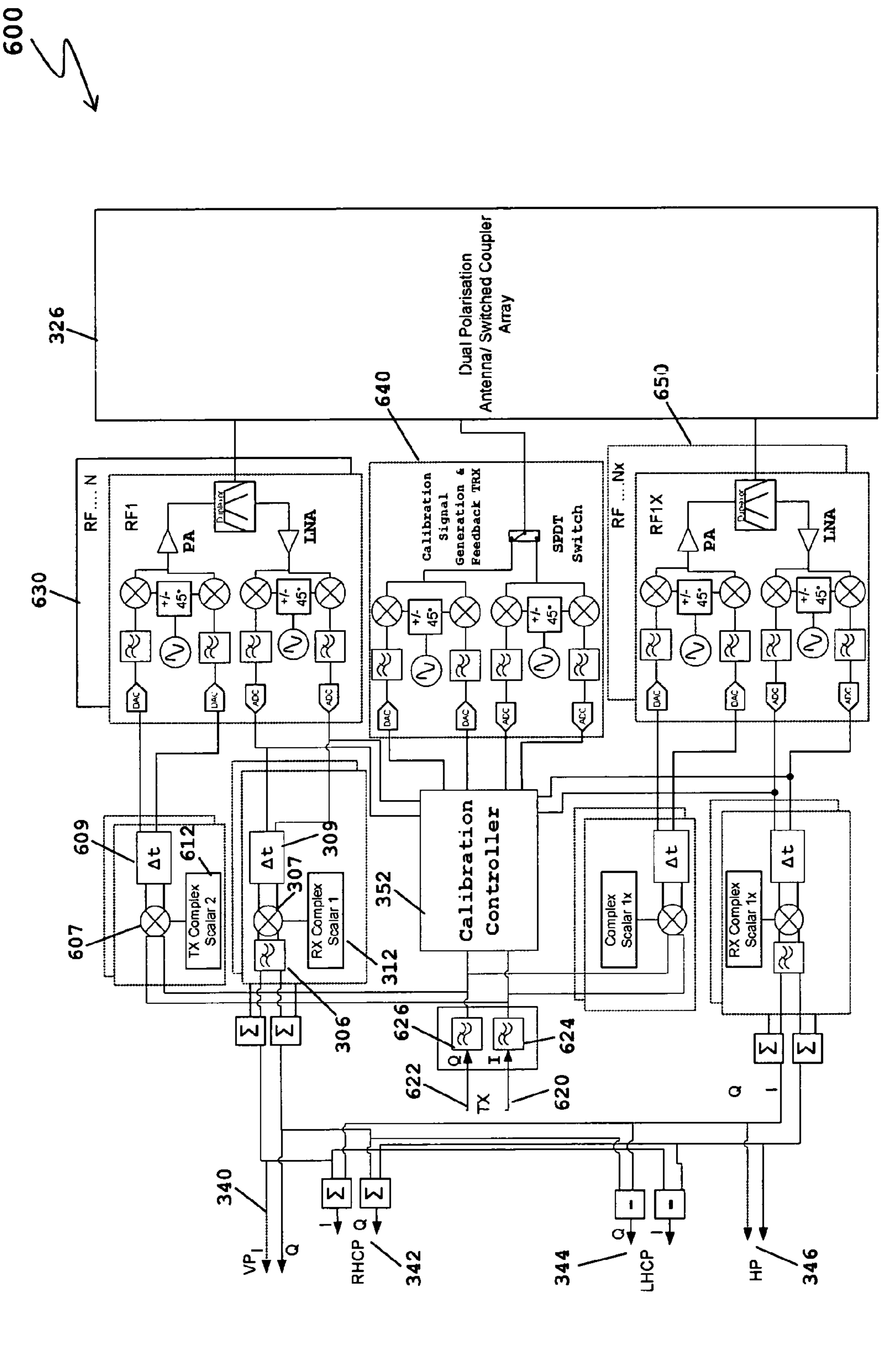
FIG. 6 illustrates an example of a part of a communication unit arranged to support multiple polarization types using a transceiver antenna array.

Referring now to FIG. 6, an example of a part of a communication unit 600 is illustrated, where the communication unit 600 is arranged to support multiple polarization types using a plurality of transceivers operably coupled to an orthogonally polarized antenna array and switched coupler arrangement 326. In FIG. 6, the same principle as outlined previously is applied to an antenna array. Multiple pairs of XPOL elements are used, which can be additionally used to implement beamforming functionality. Beamforming is the generation of a desired radiation pattern emanating to and from the antenna array. A plurality of receivers and phase/amplitude/latency configuration modules 307, 309, 312, 607, 609, 612, are implemented. The output of the receiver paths and subsequent beamforming processing are added to form receive beams generated of one linear polarization type, 340. Conversely, the other orthogonal linear polarization type is generated in a similar fashion, 346. If there is substantially a 90° offset phase offset relationship added to the scalar values stored in one or more memory modules 312 on one path versus the other, then LHCP and RHCP signal can be generated, as described with reference to FIG. 5. Digital signals received from the antenna as referenced in this disclosure are communicated to a baseband processor unit. The baseband processing unit completes the demodulation process of decoding the signals. In one example, a transport layer is provided to communicate such information to a baseband processing unit. In a handset device, this transport layer may be a MIPI DigRF based protocol. In a network element, such as in cellular infrastructure equipment, the transport layer may be a CPRI or OBSAI RP3-01 link. In this manner, an antenna array is able to be configured to have the same functionality of that described for a single element XPOL antenna.

Likewise, TX signals are IQ sample signals output from the BB processing unit to be used for transmission.

In this example, a calibration signal generation and calibration feedback detection transceiver circuitry 640 comprises a double pole double throw switch arranged to route a single feedback or calibration signal from the coupler structure 326. The function of the calibration signal generation and feedback transceiver circuitry is to connect the feedback point to the respective coupler path under calibration measurement. For receive calibration the calibration signal generation and feedback transceiver circuitry is arranged to up-convert the calibration signal to the frequency of operation of the receiver under measurement. For transmit operation, the calibration signal generation and feedback transceiver circuitry is arranged to down-convert to baseband a RF signal, for example a RF signal under test of the transmitter. Advantageously, much of the feedback or signal generation is common, thereby minimising impact to measurement results in conjunction with the normalising algorithm.

In both cellular network infrastructure and user equipment it is common to use a second receive path, a so called diversity path. This receive path is usually of orthogonal polarization to the primary receive path. Even when a strong signal, i.e. a signal that is significantly above the noise floor of the receiver, is received both paths are similarly processed as if the signals were noise limited. This is because processing one path only may not match the polarization of the transmitting antenna, thus causing an unacceptable degradation in signal level and consequently signal-to-noise ratio (SNR).

In one example embodiment, many transceiver devices are arranged to be capable of configuration for optimal receive and/or transmit polarization types. For example, in cases where the signal level (and consequently SNR) is sufficiently high, the communication unit may be configured to use CP generation hardware without 90° offset applied to the scalar values stored in one or more memory modules 310, 312 to combine signals for both LP orthogonal XPOL antenna elements without significantly degrading the performance of the receiver. Such a technique is described in FIG. 9. In this case, the diversity processing may allow either switching off to save power in a case of a handset device or for infrastructure equipment the extra processing capability of the diversity processing can be used to process other antenna signals, such as different beam types.

Figure 7:
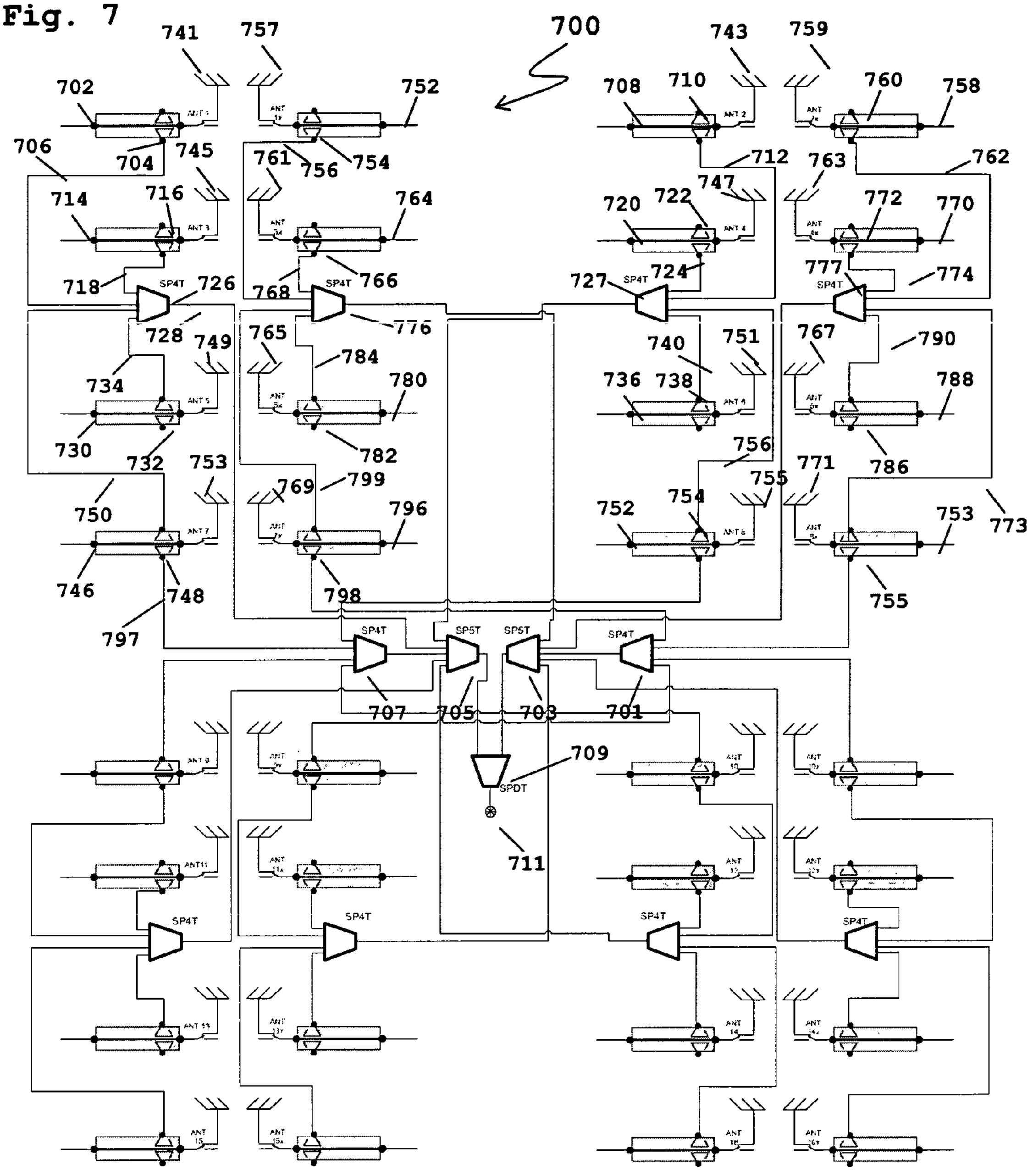
FIG. 7 illustrates an example of a coupler structure.

Referring now to FIG. 7, a more detailed example of a switched coupler structure 326 utilized in calibrating a beamform antenna array is illustrated in accordance with the network element example embodiment of FIG. 6. The example coupler structure of FIG. 7 comprises an antenna array containing sixteen cross polarized antenna elements of two columns and eight rows, each element with a coupled feedback structure connected through a plurality of switchplexer devices to a common feedback point for all antennas and all polarization types.

Thirty two transceivers ports are illustrated of the coupler structure of FIG. 7. For simplicity purposes only top half of the antenna coupler array sections will be described. It will be appreciated that the symmetric nature does not warrant further description. Sixteen XPOL antenna element pairs are utilized in the antenna array. The antenna elements comprise of sixteen elements of −45° polarization 741, 743, 745, 747, 749, 751, 753, 755 and sixteen elements of +45° polarization 757, 759, 761, 763, 765, 767, 769, 771. Each antenna element of both polarization types is individually operably coupled to a first port of a respective coupler structure 704, 754, 760, 710, 716, 764, 722, 772, 726, 732, 782, 738, 788, 748, 798, 754. Thirty two transceiver ports 702, 752, 708, 758, 714, 764, 720, 770, 730, 780, 736, 788, 746, 792, 752, 753 are also each individually operably coupled to a second port of the respective coupler structures 704, 754, 760, 710, 716, 764, 722, 772, 726, 732, 782, 738, 788, 748, 798, 754. Each transceiver port 702, 752, 708, 758, 714, 764 720, 770, 730, 780, 736, 788, 746, 792, 752, 753 is also operably coupled to a respective transceiver port on the transceiver array in the communications element, for example transceiver arrays 630, 650 in FIG. 6. Sixteen transceiver ports 702, 752, 708, 758, 714, 764, 720, 770, 730, 780, 736, 788, 746, 792, 752, 753 are operably coupled to transceiver array 630 and another sixteen transceiver ports are operably coupled to transceiver array 650. Transceiver array 630 processes signals of antenna elements of −45° polarization 741, 743, 745, 747, 749, 751, 753, 755 whereas transceiver array 650 processes antenna elements of +45° polarization 757, 759, 761, 763, 765, 767, 769, 771. Coupler structures 704, 754, 760, 710, 716, 764, 722, 772, 726, 732, 782, 738, 788, 748, 798, 754 have two couple ports, of which a minimum of one couple port is operably coupled to switchplexer network 726, 727, 707, 701, 776, 766, 777, 703, 705.

The switchplexer network allows the calibration signal generation and calibration feedback detection transceiver circuitry 640 to operably couple to a single respective coupler structure port at a particular instant of time. The calibration signal generation and calibration feedback detection transceiver circuitry 640 is operably connected to the switchplexer network output port 711.

The operation of the switched coupler structure 326 of FIG. 7 may be better understood when considering the following example signal flows.

For example, a signal on Ant3 745 can be coupled back/through coupler structure 716 to a switchplexer port 718. The switchplexer 726 can be selected to output/input this coupled signal to switchplexer 705. The switchplexer 705 can input/output this signal to the single-pole double-throw (SPDT) switch 709, whose output port may be operably coupled to calibration signal generation and calibration feedback detection transceiver circuitry 640 of FIG. 6. Let us consider a case of a transmitter calibration using a signal on Ant7 753. If the signal coupled back measured differently between the different feedbacks, e.g. via switchplexer 726 port A 750 and a different switchplexer 707 port B 797, then it may be assumed that the error may be attributed as a feedback path mismatch. This feedback mismatch may then be negated from the corresponding phase/amplitude/latency correction of all signal paths using switchplexer 726 output A 718, thus substantially minimising the feedback error. Furthermore, this mismatch error can be applied to all other signals coupled through switchplexer A Conversely for receive calibration, a signal may first be input to switchplexer port A 718, then switchplexer port B 797, and corresponding receive measurements will allow negation of mismatch on the feed-forward calibration signal paths.

The proposed coupler matrix is able to scale below and beyond a use of thirty two antennae, and is not restrictive to an array size. Thus, in this manner, an antenna array of cross polarization elements are combined together to create radiation beams of various polarization types, en route to/from Node B baseband processing, in a controlled manner in part due to the calibration teachings outlined. The respective antenna paths can be calibrated separately to determine absolute process path delays, phase response and amplitude response of signal processing path feeds to the antenna cross polarized antenna elements. These absolute responses may be compared with respect to each other in order to determine the mismatches on each path. These mismatches may be used to modify beamform weights, for example beamform weights 612 of FIG. 6 and applied to a complex scalar module for example complex scalar module 607 of FIG. 6. Furthermore the beamform weights can be modified to effect the desired polarization, which in many cases can be a 90° phase shift.

Figure 8:
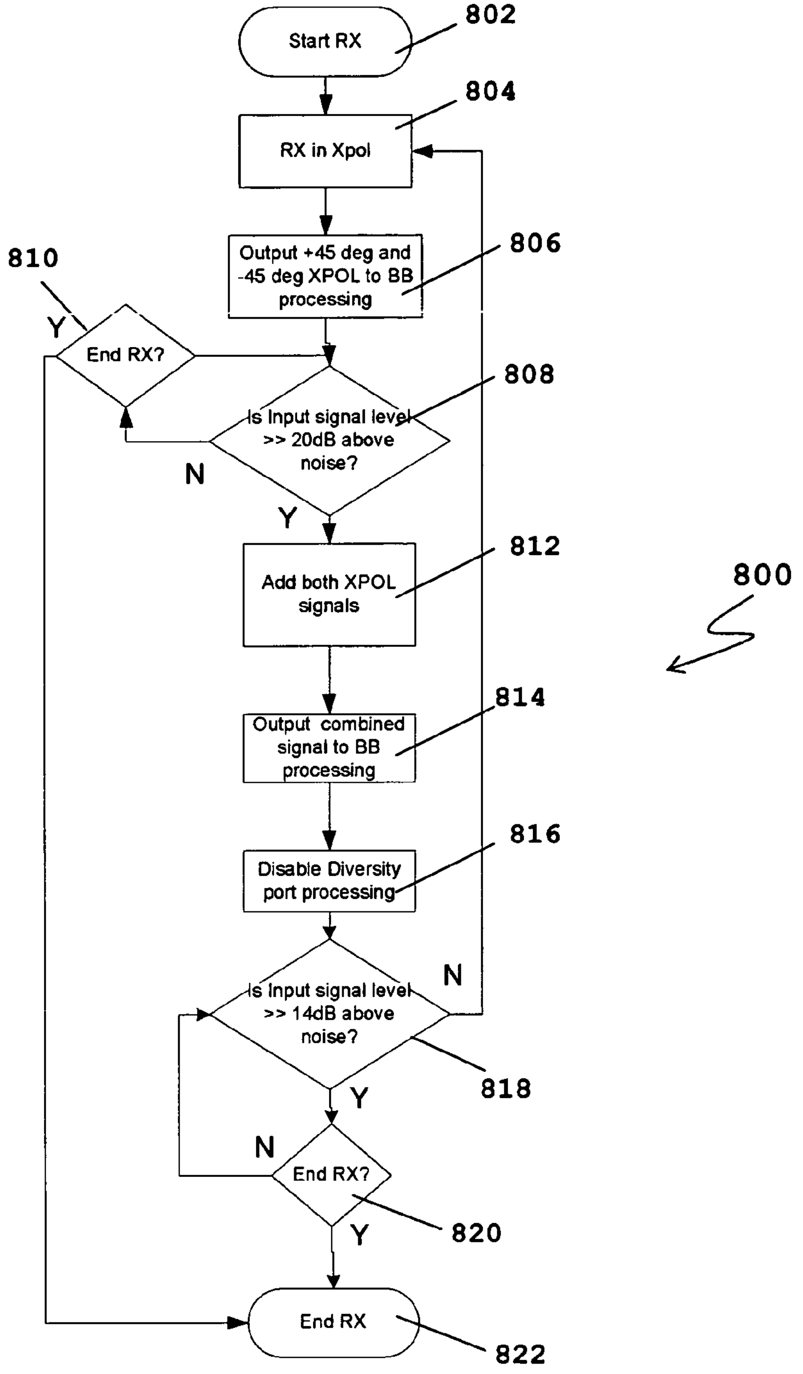
FIG. 8 illustrates an example of a flowchart for disabling a receive processing of polarization antenna diversity information.

Referring now to FIG. 8, a flowchart 800 provides one example method of disabling a diversity baseband demodulation processing path. In mobile or subscriber-based wireless communication unit designs, it is known that signal baseband demodulation processing overhead dominates the amount of current drain in many modes of operation. Hence, the method illustrated in FIG. 8 for disabling of a diversity baseband demodulation processing path (or any such multiple beam formation path) provides a useful power saving feature, which is particularly advantageous in an application where the wireless communication unit employing the antenna design is a mobile or subscriber-based wireless communication unit. One example method reverts to using hardware used for circular polarization (CP) to a signal of added XPOL signal reception once the signal is sufficiently above the noise floor of the receiver.

The flowchart commences in step 802 with a start of a receive operation. The receiver starts the communication using cross polarized antenna signal processing in step 804. The communication unit receiving the cross polarized signal at the antenna port in step 804 converts the cross polarized signal to a baseband processing module in step 806 and outputs respective +45 deg. and −45 deg. signals. A determination is then made by a baseband processing module as to whether the received signal level is above a predetermined first threshold level, for example 20 dB above the receiver noise floor, as shown in step 808. If the determination is that the received signal level is not above the predetermined first threshold level in step 808, a determination is made as to whether the receive operation has terminated, as shown in step 810. If the receive operation has terminated in step 810, the process ends in step 822. If the receive operation has not terminated in step 810, the process loops back to step 808 and the receiver continues to use the cross polarization.

However, referring back to step 808, if the determination is that the received signal level is above the predetermined first threshold level, both cross polarized output signals (+45 deg. and −45 deg.) are added in step 812 and the combined signal is output to the baseband processing module in step 814. Thus, when the received signal level is above the predetermined first threshold level (e.g. the SNR>20 dB) the receiver reverts to using a single baseband demodulation process using a combined signal processing path. In addition, for received signals of a particular (high) signal level, the flowchart proposes an optional step of disabling baseband processing and output of signals to the baseband receiver of a second receiver path, for example disabling a diversity processing port in the baseband processing module, as shown in step 816.

As the received signal level is typically constantly changing, a hysteresis loop is included in the flowchart to accommodate for changes of the received signal level over time. Here, a determination is then made by a baseband processing module as to whether the received signal level is above a predetermined second threshold level, for example 14 dB above the noise floor, as shown in step 818. If the determination is that the received signal level is not above the predetermined second threshold level in step 818, that is the SNR has degraded to a level that is below the predetermined second threshold of, say, 14 dB, diversity processing paths are enabled when the process loops back to step 804. Thus, cross polarization processing is resumed at the output of both diversity paths to the baseband processing module in step 806.

If however, at step 818, the determination is that the received signal level is above the predetermined second threshold level, a determination is made as to whether the receiver operation is terminated, in step 820. If the receiver operation is not terminated, in step 820, the process loops back to step 818. If the receiver operation is terminated, the process ends at step 822.

Figure 9:
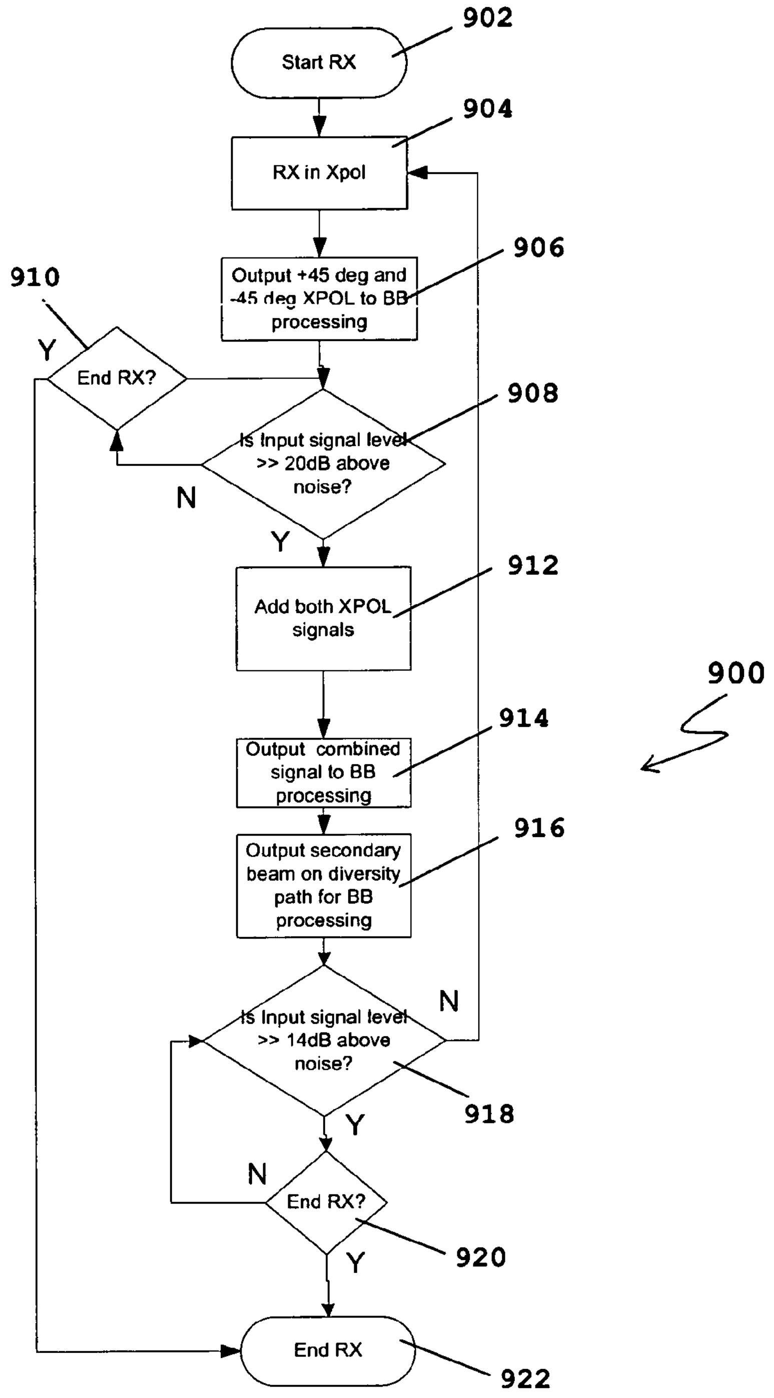
FIG. 9 illustrates flowchart example for performing receive processing of polarization antenna diversity information.

Referring now to FIG. 9, a flowchart 900 provides one example method of optimally using diversity processing capability in a Node B. One example method reverts to using hardware used for circular polarization (CP) to be added to XPOL signal reception, once the signal is sufficiently above the noise floor of the receiver.

The flowchart commences in step 902 with a start of a receive operation. The receiver starts the communication using a cross polarized signal at the antenna port in step 904. The communication unit receiving the cross polarized signal at the antenna port in step 904 converts the cross polarized signal to a baseband processing module in step 906 and outputs respective +45 deg. and −45 deg. signals. A determination is then made by a baseband processing module as to whether the received signal level is above a predetermined first threshold level, for example 20 dB above the noise floor, as shown in step 908. If the determination is that the received signal level is not above the predetermined first threshold level in step 908, a determination is made as to whether the receive operation has terminated, as shown in step 910. If the receive operation has terminated in step 910, the process ends in step 922. If the receive operation has not terminated in step 910, the process loops back to step 908 and the receiver continues to use the cross polarization.

However, referring back to step 908, if the determination is that the received signal level is above the predetermined first threshold level, both cross polarized output signals (+45 deg. and −45 deg.) are added in step 912 and the combined signal is output to the baseband processing module in step 914. Thus, when the received signal level is above the predetermined first threshold level (e.g. the SNR>20 dB) the receiver reverts to using a combined signal processing path for one demodulation processing port, thereby freeing up at least one processing module in the node-B baseband. In addition, for received signals of a particular (high) signal level, the flowchart proposes an optional step for the antenna array to generate at least one other beam for processing. One example uses the generation of a beam of higher antenna gain in the direction of the incoming signal. Advantageously, the ability to free up a diversity processing port and module in the baseband processing module and use this diversity processing port for processing a different beam can improve link performance without the need for the baseband processing unit to support extra such processing modules. Thus, in one example, a secondary beam located on a separate diversity path is output to the baseband processing module, as shown in step 916.

An example of the formation of such a secondary beam on a same frequency to improve link performance of the network is described in a co-pending Patent Application GB0902407.6 by the same applicant, the formation of which is incorporated herein by reference. As the received signal level is typically constantly changing, a hysteresis loop is included in the flowchart to accommodate for changes of the received signal level over time. Here, a determination is then made by a baseband processing module as to whether the received signal level is above a predetermined second threshold level, for example 14 dB above the noise floor, as shown in step 918. If a signal level of less than 14 dB is triggered in step 918, a determination is made as to whether to revert to reception of diversity processing mode. A state machine for control reverts back to step 904 for reception in linear cross polarization modes and outputs the desired beams to the baseband processor, as described in step 906 where the loop repeats per that outlined heretofore.

If, in step 918, the determination is that the received signal level is above the predetermined second threshold level, a determination is made as to whether the receiver operation is terminated, in step 920. If the receiver operation is not terminated, in step 920, the process loops back to step 918. If the receiver operation is terminated, the process ends at step 922.

Figure 10:
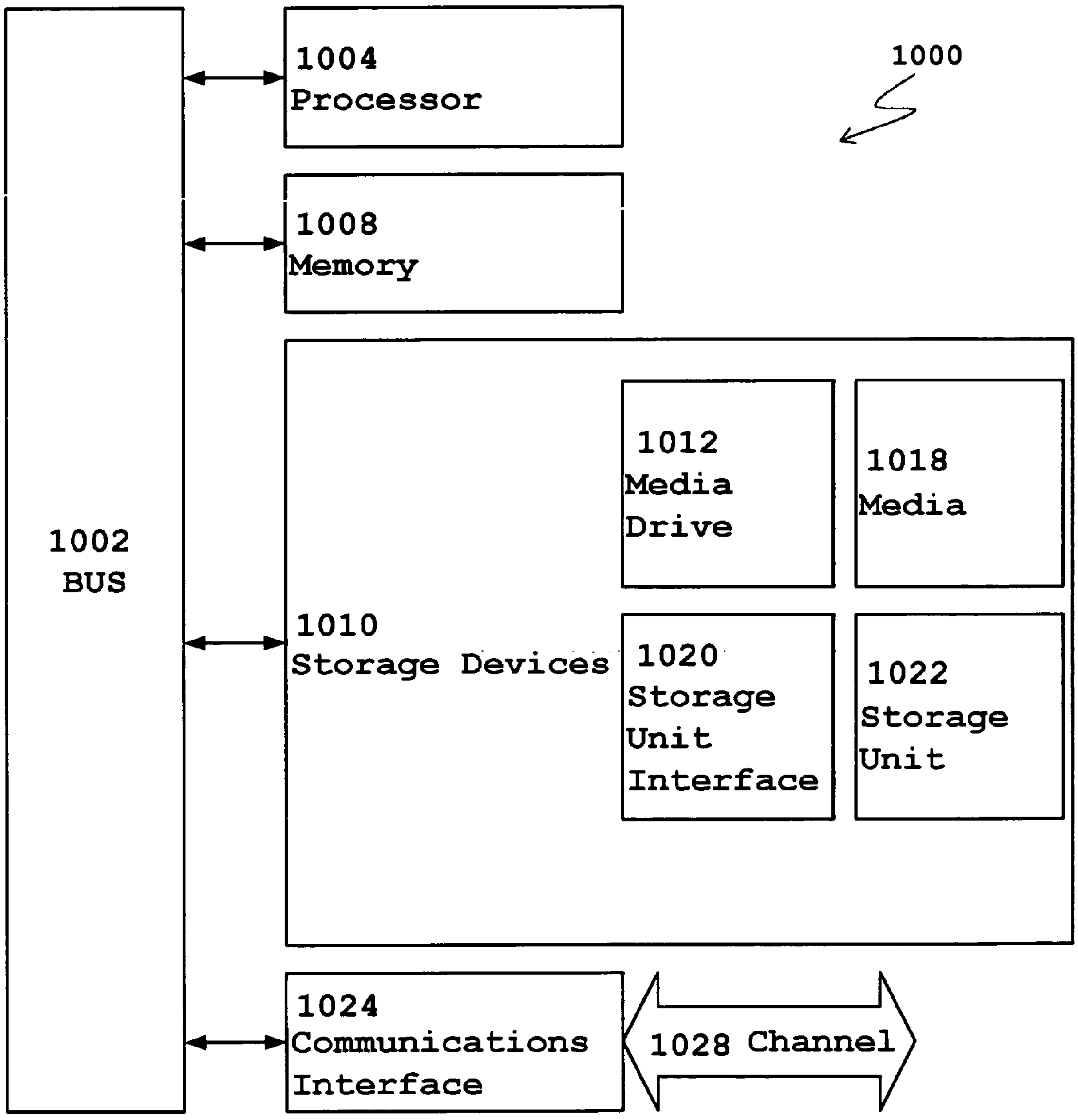
FIG. 10 illustrates a typical computing system that may be employed to implement signal processing functionality in embodiments of the invention.

Referring now to FIG. 10, there is illustrated a typical computing system 1000 that may be employed to implement signal processing functionality in embodiments of the invention. Computing systems of this type may be used in access points and wireless communication units. Those skilled in the relevant art will also recognize how to implement the invention using other computer systems or architectures. Computing system 1000 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 1000 can include one or more processors, such as a processor 1004. Processor 1004 can be implemented using a general or special-purpose processing engine such as, for example, a microprocessor, microcontroller or other control logic. In this example, processor 1004 is connected to a bus 1002 or other communications medium.

Computing system 1000 can also include a main memory 1008, such as random access memory (RAM) or other dynamic memory, for storing information and instructions to be executed by processor 1004. Main memory 1008 also may be used for storing temporary variables or other intermediate information during execution of instructions to be executed by processor 1004. Computing system 1000 may likewise include a read only memory (ROM) or other static storage device coupled to bus 1002 for storing static information and instructions for processor 1004.

The computing system 1000 may also include information storage system 1010, which may include, for example, a media drive 1012 and a removable storage interface 1020. The media drive 1012 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 1018 may include, for example, a hard disk, floppy disk, magnetic tape, optical disk, CD or DVD, or other fixed or removable medium that is read by and written to by media drive 1012. As these examples illustrate, the storage media 1018 may include a computer-readable storage medium having particular computer software or data stored therein.

In alternative embodiments, information storage system 1010 may include other similar components for allowing computer programs or other instructions or data to be loaded into computing system 1000. Such components may include, for example, a removable storage unit 1022 and an interface 1020, such as a program cartridge and cartridge interface, a removable memory (for example, a flash memory or other removable memory module) and memory slot, and other removable storage units 1022 and interfaces 1020 that allow software and data to be transferred from the removable storage unit 1018 to computing system 1000.

Computing system 1000 can also include a communications interface 1024. Communications interface 1024 can be used to allow software and data to be transferred between computing system 1000 and external devices. Examples of communications interface 1024 can include a modem, a network interface (such as an Ethernet or other NIC card), a communications port (such as for example, a universal serial bus (USB) port), a PCMCIA slot and card, etc. Software and data transferred via communications interface 1024 are in the form of signals which can be electronic, electromagnetic, and optical or other signals capable of being received by communications interface 1024. These signals are provided to communications interface 1024 via a channel 1028. This channel 1028 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms 'computer program product' 'computer-readable medium' and the like may be used generally to refer to media such as, for example, memory 1008, storage device 1018, or storage unit 1022. These and other forms of computer-readable media may store one or more instructions for use by processor 1004, to cause the processor to perform specified operations. Such instructions, generally referred to as 'computer program code' (which may be grouped in the form of computer programs or other groupings), when executed, enable the computing system 1000 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 1000 using, for example, removable storage drive 1022, drive 1012 or communications interface 1024. The control logic (in this example, software instructions or computer program code), when executed by the processor 1004, causes the processor 1004 to perform the functions of the invention as described herein.

It will be appreciated that, for clarity purposes, the above description has described embodiments of the invention with reference to different functional units and processors. However, it will be apparent that any suitable distribution of functionality between different functional units or processors, for example with respect to the broadcast mode logic or management logic, may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

The invention claimed is:

1. A method for processing at least one polarization type of at least one wireless signal by a communication unit operably couplable to an antenna arrangement that comprises at least two orthogonally polarized antenna elements, the method comprising:

processing at least one signal as radiated by at least one first antenna element of the antenna arrangement; and processing the digitized format of the at least one signal by applying at least one digital complex scaling operation on the at least one signal as radiated by at least one second antenna element of orthogonal polarization to the at least one first antenna element of the antenna arrangement thereby radiating at least one wireless signal of at least one non-native polarization type;

providing a digitized feedback signal to a calibration controller representative of a coupled signal at the antenna port; and performing at least one from a group of: phase correction, amplitude correction, latency correction, on the at least one signal.

2. The method of claim 1 wherein processing comprises modifying the at least one digital complex scaling applied to the at least one signal radiated by the at least one second antenna element to radiate a different polarization type.

3. The method of claim 1 wherein processing the at least one signal radiated by at least one first antenna element of the antenna arrangement comprises processing the at least one signal such that at least one further wireless signal of native polarization type is radiated by the at least one first antenna element.

4. The method of claim 3 wherein the native and non-native polarization types comprise at least one of: a linear polarization type and a circularly polarization type, a left hand circularly polarization type, a right hand circularly polarization type.

5. The method of claim 1 wherein at least one of: the native or non-native polarization type comprises a polarization type from a group of:

(i) a cross polarization type;

(ii) a circularly polarization type;

(iii) a linear polarization type;

(iv) an elliptical polarization type.

6. The method of claim 1 further comprising concurrently processing a plurality of polarization types of at least one wireless signal.

7. The method of claim 1 wherein the at least one signal processed by at least one signal radiated by the at least one first antenna element of the antenna arrangement and the at least one signal radiated by the at least one second antenna element of orthogonal polarization to the at least one first antenna element of the antenna arrangement is the same signal.

8. The method of claim 1 wherein the at least one signal radiated by the at least one first antenna element of the antenna arrangement and the at least one signal radiated by the at least one second antenna element of orthogonal polarization to the at least one first antenna element of the antenna arrangement are different signals.

9. The method of claim 1 wherein processing the at least one signal radiated by the at least one second antenna element comprises processing a modified version of the at least one signal radiated by the at least one first antenna element.

10. The method of claim 1 wherein processing the at least one signal radiated by the at least one first antenna element comprises processing a received wireless signal of a native polarization type and processing the at least one signal radiated by the at least one second antenna element comprises processing a wireless transmit signal of the non-native polarization type.

11. The method of claim 1 further comprising:

determining whether a signal level of a received wireless signal exceeds a threshold level; and selecting a polarization process type to be applied to the received signal based thereon.

12. The method of claim 11 further comprising applying a diversity process type in response to determining that the signal level of the received wireless signal exceeds the threshold level.

13. The method of claim 1 wherein providing the digitized feedback signal comprises providing a digital feedback representing a plurality of a coupled signals at the antenna port using a common path shared amongst a plurality of antenna elements of the antenna arrangement.

14. The method of claim 1 further comprising:

providing a digitized reception of a known signal polarization type that is propagated wirelessly to the antenna arrangement feedback to a calibration controller; and performing on the at least one signal in response thereto, at least one from a group of: phase correction, amplitude correction, latency correction.

15. The method of claim 1 further comprising:

providing a signal to a calibration controller operably coupled to a receiver; and performing on the at least one signal, at least one from a group of: phase correction, amplitude correction, latency correction.

16. The method of claim 1 further comprising:

receiving a wireless signal from at least one base station or the antenna arrangement;

performing radio frequency conversion to down-convert the received wireless signal to a baseband calibration signal;

performing analogue-to-digital conversion to convert the baseband signal calibration to a digitized calibration signal;

processing the digitized calibration signal;

performing active adjustment on a baseband signal in response to the processed baseband calibration signal to create a signal of a non-native polarization type at the second antenna element;

performing digital-to-analogue conversion to convert the adjusted digitized signals to analogue signals;

up-converting the analogue signals to a wireless signal for forwarding to the second antenna element.

17. The method of claim 1 wherein the at least one first antenna element or the at least one second antenna element of the antenna arrangement is a dual polarized patch antenna arranged to support a native linear polarization type.

18. The method of claim 1 wherein applying digital complex scaling comprises at least one from a group of:

processing multiple baseband signals of multiple polarization types;

applying scaling to the at least one signal radiated by either of the first antenna element or second antenna element to form an elliptically polarized signal.

19. The method of claim 1 wherein processing the at least one signal by applying at least one digital complex scaling operation on the at least one signal radiated by at least one second antenna element comprises concurrently applying on the at least one signal at least one from a group of: beamforming, IQ imbalance correction, mismatch correction.

20. The method of claim 1 wherein the at least one antenna element is located on one from a group of: a wireless subscriber device, a network infrastructure element.

21. A tangible computer program product comprising program code stored therein for processing at least one polarization type of at least one wireless signal by a communication unit operably couplable to an antenna arrangement that comprises at least two orthogonally polarized antenna elements, the computer program product comprising program code operable for, when executed at a communication unit, performing the method of claim 1.

22. A communication unit comprising:

an interface for coupling to an antenna arrangement that comprises at least two orthogonally polarized antenna elements;

a signal processor arranged to:

process at least one signal as radiated by at least one first antenna element of the antenna arrangement;

process a digital format of at least one signal by applying at least one digital complex scaling operation on the at least one signal as radiated by at least one second antenna element of orthogonal polarization to the at least one first antenna element of the antenna arrangement thereby radiating at least one wireless signal of at least one non-native polarization type;

provide a digitized feedback signal to a calibration controller representative of a coupled signal at the antenna port; and perform at least one from a group of: phase correction, amplitude correction, latency correction, on the at least one signal.

23. An integrated circuit for a communication unit comprising:

an interface for coupling to an antenna arrangement that comprises at least two orthogonally polarized antenna elements;

a signal processor arranged to:

process at least one signal as radiated by at least one first antenna element of the antenna arrangement;

process a digital format of at least one signal by applying at least one digital complex scaling operation on the at least one signal as radiated by at least one second antenna element of orthogonal polarization to the at least one first antenna element of the antenna arrangement thereby radiating at least one wireless signal of at least one non-native polarization type;

provide a digitized feedback signal to a calibration controller representative of a coupled signal at the antenna port; and perform at least one from a group of: phase correction, amplitude correction, latency correction, on the at least one signal.

* * * * *